(12) United States Patent
Yamazaki et al.

(10) Patent No.: US 10,401,662 B2
(45) Date of Patent: Sep. 3, 2019

(54) LIQUID CRYSTAL DISPLAY DEVICE AND TOUCH PANEL

(71) Applicant: Semiconductor Energy Laboratory Co., Ltd., Atsugi-shi, Kanagawa-ken (JP)

(72) Inventors: Shunpei Yamazaki, Setagaya (JP); Yoshiharu Hirakata, Ebina (JP); Daisuke Kubota, Atsugi (JP); Akio Yamashita, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/994,059

(22) Filed: May 31, 2018

(65) Prior Publication Data

US 2018/0284499 A1    Oct. 4, 2018

Related U.S. Application Data

(63) Continuation of application No. 15/437,599, filed on Feb. 21, 2017, now Pat. No. 10,007,133, which is a
(Continued)

(30) Foreign Application Priority Data

Oct. 12, 2012 (JP) .................................. 2012-227335

(51) Int. Cl.
*G02F 1/1333* (2006.01)
*G02F 1/1341* (2006.01)
(Continued)

(52) U.S. Cl.
CPC .......... *G02F 1/1333* (2013.01); *G02F 1/1341* (2013.01); *G02F 1/1368* (2013.01);
(Continued)

(58) Field of Classification Search
CPC ........... H01L 29/7869; H01L 29/78696; H01L 29/045; H01L 23/3142; H01L 27/1225;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    101419371 A    4/2009
CN    101750821 A    6/2010
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
(Continued)

*Primary Examiner* — Thoi V Duong
(74) *Attorney, Agent, or Firm* — Robinson Intellectual Property Law Office; Eric J. Robinson

(57) ABSTRACT

To provide a highly reliable liquid crystal display device including flexible substrates and a crystalline oxide semiconductor film for a backplane. The device includes a flexible first substrate, a flexible second substrate facing the first substrate, and a liquid crystal layer sealed between the substrates with a sealing member. The first substrate is provided with a layer including a transistor, an organic resin film over the transistor, a pixel electrode and a common electrode over the organic resin film, which partly overlap with each other with an insulating film provided therebetween, and an alignment film thereover. The transistor includes a crystalline oxide semiconductor film as a semi-
(Continued)

conductor layer where a channel is formed. Drying treatment is performed on the layer before the liquid crystal layer is sealed between the substrates, and steps from the drying treatment to sealing of the liquid crystal layer are performed without exposure to the air.

21 Claims, 26 Drawing Sheets

Related U.S. Application Data continuation of application No. 14/050,999, filed on Oct. 10, 2013, now abandoned.

(51) Int. Cl.
| | | |
|---|---|---|
| G06F 3/041 | (2006.01) | |
| H01L 29/786 | (2006.01) | |
| H01L 27/12 | (2006.01) | |
| G06F 3/044 | (2006.01) | |
| G02F 1/1343 | (2006.01) | |
| G02F 1/1368 | (2006.01) | |
| H01L 29/04 | (2006.01) | |

(52) U.S. Cl.
CPC .... *G02F 1/13338* (2013.01); *G02F 1/133305* (2013.01); *G02F 1/133345* (2013.01); *G02F 1/134309* (2013.01); *G06F 3/044* (2013.01); *G06F 3/0412* (2013.01); *H01L 27/1225* (2013.01); *H01L 29/7869* (2013.01); *H01L 29/78696* (2013.01); *G02F 2001/13415* (2013.01); *G02F 2201/121* (2013.01); *G02F 2201/123* (2013.01); *G02F 2202/10* (2013.01); *G06F 2203/04103* (2013.01); *H01L 29/045* (2013.01)

(58) Field of Classification Search
CPC ............... H01L 27/1262; H01L 27/127; H01L 27/1259; H01L 27/3244; H01L 27/3248; H01L 21/76838; H01L 21/02488; G02F 1/13; G02F 1/136; G02F 1/1368; G02F 1/133345; G02F 1/133305; G02F 1/13338; G02F 1/1339; G02F 1/1341; G02F 1/134309; G02F 1/136227; G02F 1/1362; G02F 1/1303; G02F 1/0107; G02F 1/1333; G02F 1/161; G02F 2001/133302; G02F 2001/136295; G02F 2001/13415; G02F 2201/121; G02F 2201/123; G02F 2202/10; G02F 2203/04103; G06F 3/0412
See application file for complete search history.

(56) References Cited

U.S. PATENT DOCUMENTS

| | | | |
|---|---|---|---|
| 6,197,625 | B1 | 3/2001 | Choi |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,277,140 | B2 | 10/2007 | Kurihara et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,453,539 | B2 | 11/2008 | Matsuoka et al. |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,511,301 | B2 | 3/2009 | Kimura |
| 7,598,670 | B2 | 10/2009 | Kumaki et al. |
| 7,674,650 | B2 | 3/2010 | Akimoto et al. |
| 7,732,819 | B2 | 6/2010 | Akimoto et al. |
| 7,782,426 | B2 | 8/2010 | Tanno et al. |
| 7,791,072 | B2 | 9/2010 | Kumomi et al. |
| 7,868,954 | B2 | 1/2011 | Chen et al. |
| 7,884,360 | B2 | 2/2011 | Takechi et al. |
| 7,902,512 | B1 | 3/2011 | Chang et al. |
| 7,935,964 | B2 | 5/2011 | Kim et al. |
| 7,977,255 | B1 | 7/2011 | Scheer et al. |
| 7,994,500 | B2 | 8/2011 | Kim et al. |
| 7,998,372 | B2 | 8/2011 | Yano et al. |
| 8,058,645 | B2 | 11/2011 | Jeong et al. |
| 8,058,647 | B2 | 11/2011 | Kuwabara et al. |
| 8,148,779 | B2 | 4/2012 | Jeong et al. |
| 8,168,544 | B2 | 5/2012 | Chang |
| 8,188,480 | B2 | 5/2012 | Itai |
| 8,202,365 | B2 | 6/2012 | Umeda et al. |
| 8,203,143 | B2 | 6/2012 | Imai |
| 8,207,756 | B2 | 6/2012 | Shionoiri et al. |
| 8,236,635 | B2 | 8/2012 | Suzawa et al. |
| 8,237,166 | B2 | 8/2012 | Kumomi et al. |
| 8,242,494 | B2 | 8/2012 | Suzawa et al. |
| 8,274,078 | B2 | 9/2012 | Itagaki et al. |
| 8,289,489 | B2 | 10/2012 | Im et al. |
| 8,304,765 | B2 | 11/2012 | Yamazaki et al. |
| 8,309,961 | B2 | 11/2012 | Yamazaki et al. |
| 8,319,215 | B2 | 11/2012 | Yamazaki et al. |
| 8,343,799 | B2 | 1/2013 | Ito et al. |
| 8,344,387 | B2 | 1/2013 | Akimoto et al. |
| 8,395,716 | B2 | 3/2013 | Ishitani et al. |
| 8,420,442 | B2 | 4/2013 | Takechi et al. |
| 8,482,005 | B2 | 7/2013 | Yamazaki et al. |
| 8,486,487 | B2 | 7/2013 | Fukuda et al. |
| 8,558,960 | B2 | 10/2013 | Yamazaki et al. |
| 8,570,300 | B2 | 10/2013 | Ikeda et al. |
| 8,728,883 | B2 | 5/2014 | Yamazaki et al. |
| 8,772,160 | B2 | 7/2014 | Yamazaki et al. |
| 8,786,557 | B2 | 7/2014 | Noguchi et al. |
| 8,860,685 | B2 | 10/2014 | Takeuchi et al. |
| 8,889,480 | B2 | 11/2014 | Takechi et al. |
| 8,928,620 | B2 | 1/2015 | Haga |
| 9,019,231 | B2 | 4/2015 | Minami et al. |
| 9,030,420 | B2 | 5/2015 | Noguchi et al. |
| 9,159,745 | B2 | 10/2015 | Kim et al. |
| 9,209,026 | B2 | 12/2015 | Takechi et al. |
| 9,281,358 | B2 | 3/2016 | Yamazaki et al. |
| 9,305,944 | B2 | 4/2016 | Yamazaki et al. |
| 9,335,875 | B2 | 5/2016 | Noguchi et al. |
| 9,348,189 | B2 | 5/2016 | Ishitani et al. |
| 9,366,896 | B2 | 6/2016 | Yamazaki et al. |
| 9,507,479 | B2 | 11/2016 | Minami et al. |
| 9,542,047 | B2 | 1/2017 | Noguchi et al. |
| 9,557,842 | B2 | 1/2017 | Noguchi et al. |
| 9,634,082 | B2 | 4/2017 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0089414 | A1* | 5/2004 | Makino ............... B32B 37/003 156/285 |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0221545 | A1* | 10/2005 | Kokubo ............... H01L 21/268 438/151 |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |

(56) References Cited

U.S. PATENT DOCUMENTS

| | | |
|---|---|---|
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279359 A1 | 12/2007 | Yoshida et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224239 A1 | 9/2009 | Wakita |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0073268 A1 | 3/2010 | Matsunaga et al. |
| 2010/0073615 A1 | 3/2010 | Yaguchi et al. |
| 2010/0084650 A1 | 4/2010 | Yamazaki et al. |
| 2010/0084651 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117078 A1 | 5/2010 | Kuwabara et al. |
| 2010/0123136 A1 | 5/2010 | Lee et al. |
| 2010/0133530 A1 | 6/2010 | Akimoto et al. |
| 2010/0134710 A1 | 6/2010 | Ishitani et al. |
| 2010/0155716 A1 | 6/2010 | Cheong et al. |
| 2010/0182273 A1 | 7/2010 | Noguchi et al. |
| 2010/0219410 A1 | 9/2010 | Godo et al. |
| 2010/0295042 A1 | 11/2010 | Yano et al. |
| 2010/0301329 A1 | 12/2010 | Asano et al. |
| 2010/0302202 A1 | 12/2010 | Takeuchi et al. |
| 2011/0049508 A1 | 3/2011 | Kawamura et al. |
| 2011/0062433 A1 | 3/2011 | Yamazaki |
| 2011/0062436 A1 | 3/2011 | Yamazaki et al. |
| 2011/0080549 A1 | 4/2011 | Jung et al. |
| 2011/0090416 A1 | 4/2011 | Arasawa et al. |
| 2011/0117698 A1 | 5/2011 | Suzawa et al. |
| 2011/0134345 A1 | 6/2011 | Yamazaki et al. |
| 2011/0193083 A1 | 8/2011 | Kim et al. |
| 2011/0240987 A1 | 10/2011 | Lee et al. |
| 2011/0300770 A1 | 12/2011 | Fukuda et al. |
| 2012/0075238 A1 | 3/2012 | Minami et al. |
| 2012/0132903 A1 | 5/2012 | Yamazaki et al. |
| 2012/0218485 A1 | 8/2012 | Chikama et al. |
| 2013/0168006 A1 | 7/2013 | Kida |
| 2013/0176516 A1 | 7/2013 | Ishitani et al. |
| 2014/0104507 A1 | 4/2014 | Yamazaki et al. |
| 2014/0290569 A1 | 10/2014 | Yamazaki et al. |
| 2014/0293156 A1 | 10/2014 | Kim et al. |
| 2016/0020331 A1 | 1/2016 | Kim et al. |
| 2016/0218118 A1 | 7/2016 | Yamazaki et al. |
| 2016/0259217 A1 | 9/2016 | Ishitani et al. |
| 2016/0342255 A1 | 11/2016 | Noguchi et al. |
| 2017/0097731 A1 | 4/2017 | Noguchi et al. |

FOREIGN PATENT DOCUMENTS

| | | |
|---|---|---|
| CN | 102169904 A | 8/2011 |
| EP | 1737044 A | 12/2006 |
| EP | 2226847 A | 9/2010 |
| EP | 2330626 A | 6/2011 |
| JP | 60-198861 A | 10/1985 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2008-042088 A | 2/2008 |
| JP | 2009-042899 A | 2/2009 |
| JP | 2009-103797 A | 5/2009 |
| JP | 2009-244958 A | 10/2009 |
| JP | 2010-066396 A | 3/2010 |
| JP | 2011-039478 A | 2/2011 |
| JP | 2011-146713 A | 7/2011 |
| JP | 2011-186453 A | 9/2011 |
| JP | 2011-199271 A | 10/2011 |
| JP | 2012-047801 A | 3/2012 |
| JP | 2012-068981 A | 4/2012 |
| JP | 2012-084865 A | 4/2012 |
| JP | 2012-134467 A | 7/2012 |
| KR | 2012-0119368 A | 10/2012 |
| TW | 200841100 | 10/2008 |
| TW | 201143051 | 12/2011 |
| TW | 201234244 | 8/2012 |

(56) References Cited

FOREIGN PATENT DOCUMENTS

| WO | WO-2004/114391 | 12/2004 |
|----|----------------|---------|
| WO | WO-2011/105183 | 9/2011 |
| WO | WO-2012/050060 | 4/2012 |
| WO | WO-2012/073918 | 6/2012 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9 and 16) in the $In_2O_3$—$ZnGa_2O_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No, 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-505.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No, 9, pp. 1755-1757.

Taiwanese Office Action (Application No. 102135513) dated Jan. 11, 2017.

Chinese Office Action (Application No. 201310471426.0) dated Jun. 5, 2017.

Chinese Office Action (Application No. 201310471426.0) dated Mar. 2, 2018.

Shi.B et al., Reliability of Microelectronic Devices, Nov. 30, 1999, pp. 58-60.

Chinese Office Action (Application No. 201310471426.0) dated Aug. 15, 2018.

* cited by examiner 170, 174, 180, 185, 181

| Specifications of Liquid Crystal Panel | |
|---|---|
| Panel Size | 3.64 inch |
| Number of Pixels | 540(H) × RGB × 960(V) : Q H D |
| Resolution | 302dpi |
| Pixel Size | 28 μm × 84 μm |
| Aperture Ratio | About 67% |
| Image Signal System | Analog Dot Sequential |
| Gate Driver | Integrated |
| Source Driver | Integrated |
| Liquid Crystal | FFS mode |

LIQUID CRYSTAL DISPLAY DEVICE AND TOUCH PANEL

BACKGROUND OF THE INVENTION

1. Field of the Invention

The present invention relates to a liquid crystal display device including a transistor using an oxide semiconductor film and a touch panel including the liquid crystal display device.

2. Description of the Related Art

Transistors which are used for many liquid crystal display devices and organic EL display devices have been formed using a silicon semiconductor film such as an amorphous silicon film or a polycrystalline silicon film.

Instead of the silicon semiconductor film, a technique in which an oxide semiconductor film is used for transistors has attracted attention.

For example, a technique is disclosed in which a transistor manufactured using an In—Ga—Zn oxide film as an oxide semiconductor film is used as a switching element or the like of a pixel (see Patent Documents 1 and 2).

Further, we develop a technique in which an oxide semiconductor film having a noble crystal structure is manufactured over a glass substrate (see Non-Patent Document 1).

REFERENCE

Patent Document

[Patent Document 1] Japanese Published Patent Application No. 2006-165528
[Patent Document 2] Japanese Published Patent Application No. 2007-096055

[Non-Patent Document]

[Non-Patent Document 1] Shunpei Yamazaki, et al., "Research, Development, and Application of Crystalline Oxide Semiconductor", *SID* 2012 *DIGEST*, pp. 183-186

SUMMARY OF THE INVENTION

An oxide semiconductor is a semiconductor material whose band gap is wider than that of silicon and whose intrinsic carrier density is lower than that of silicon. Thus, a transistor including an oxide semiconductor film (hereinafter referred to as an oxide semiconductor transistor) can have extremely lower off-state current than a transistor including an amorphous silicon film or a polycrystalline silicon film. As a result, when a backplane (circuit board) of a liquid crystal display device or an organic EL display device is manufactured using an oxide semiconductor transistor, the display device can have low power consumption.

In addition, with a transistor including a crystalline oxide semiconductor film, the density of pixels can be increased, and high definition of a display device can be achieved (see Non-Patent Document 1).

In view of fossil fuel exhaustion, environmental problems, and the like, all kinds of electronic devices are required to consume less power. Liquid crystal display devices are no exception. It is known that power consumption of liquid crystal display devices varies depending on a method for applying an electric field to a liquid crystal layer (display mode). Power consumption for changing alignment of a liquid crystal material (rewriting a pixel) in a horizontal electric field mode is lower than that in a vertical electric field mode such as a twisted nematic (TN) mode or a vertical alignment (VA) mode.

Since a liquid crystal display device of a horizontal electric field mode can have a wider viewing angle than that of a vertical electric field mode, in recent years, liquid crystal display devices with a variety of screen sizes are used as display devices of television devices, mobile devices, and the like.

In a liquid crystal display device of a horizontal electric field mode, a pixel electrode and a common electrode are provided on a substrate side of a pair of substrates which are arranged with a liquid crystal layer provided therebetween, where a transistor is manufactured, and an electric field in a substantially horizontal direction is applied to a liquid crystal molecule. Typical examples of a horizontal electric field mode are an in-plane-switching (IPS) mode and a fringe field switching (FFS) mode.

By a combination of a horizontal electric field mode and a transistor including a crystalline oxide semiconductor film, high definition and low power consumption of a liquid crystal display device can be achieved, and high performance of a touch panel can also be achieved.

On the other hand, improvement in reliability is a big issue for mass production of a liquid crystal display device including an oxide semiconductor transistor for a backplane.

A substrate having flexibility has advantages in that mechanical strength with respect to vibration and shock is excellent as compared to a glass substrate, the thickness is easily suppressed, and a degree of freedom in shape is high. Therefore, a semiconductor device using the substrate having flexibility is expected to have a variety of applications.

In view of the above, an object of one embodiment of the present invention is to provide a highly reliable liquid crystal display device which uses a flexible substrate and is manufactured using a crystalline oxide semiconductor film for a backplane.

It is found from our research that entry of water into an oxide semiconductor film is one of big facts of a change in electric characteristics of an oxide semiconductor transistor. Entry of water into the oxide semiconductor film increases carrier density, so that electric characteristics of the transistor are varied.

For that reason, a liquid crystal display device is manufactured using a material containing water as little as possible and by a structure and a manufacturing method which prevent entry of water as much as possible, which leads to resolution of decrease in reliability.

However, limitation of a material causes new problems in that display quality of a liquid crystal display device is decreased and that existing equipment in a manufacturing factory of liquid crystal display devices cannot be used; thus, early practical application of liquid crystal display devices including an oxide semiconductor is hindered.

For example, in order to suppress defective orientation of a liquid crystal molecule, it is preferable that a planarization film be formed as a base film of a pixel electrode. Since the planarization film needs to be formed thick so as to reduce unevenness of a transistor, an organic resin film is generally used as a planarization film. However, an organic resin film has a higher hygroscopic property than an inorganic insulating film; thus, there is a problem in combination with an oxide semiconductor transistor.

In view of the above, in a liquid crystal display device of one embodiment of the present invention, over a substrate having heat resistance, an element layer including an oxide semiconductor transistor, an organic resin film over the oxide semiconductor transistor, a pixel electrode and a common electrode over the organic resin film, and an alignment film over the pixel electrode and the common electrode is formed, the element layer is transferred to a first substrate having flexibility, and then, drying treatment is performed before a liquid crystal layer is sealed between the first substrate and a second substrate having flexibility. Steps from the drying treatment to sealing of the liquid crystal layer are performed without exposure to the air.

Further, one embodiment of the present invention is a touch panel including the liquid crystal display device of the above embodiment as a display portion.

According to the technique disclosed in this specification, a liquid crystal display device having as high reliability as a practical level, which uses a flexible substrate and includes an oxide semiconductor transistor for a backplane, can be provided.

BRIEF DESCRIPTION OF THE DRAWINGS

In the accompanying drawings:

FIG. 29 shows an example of specifications of a liquid crystal panel;

DETAILED DESCRIPTION OF THE INVENTION

Figure 1:
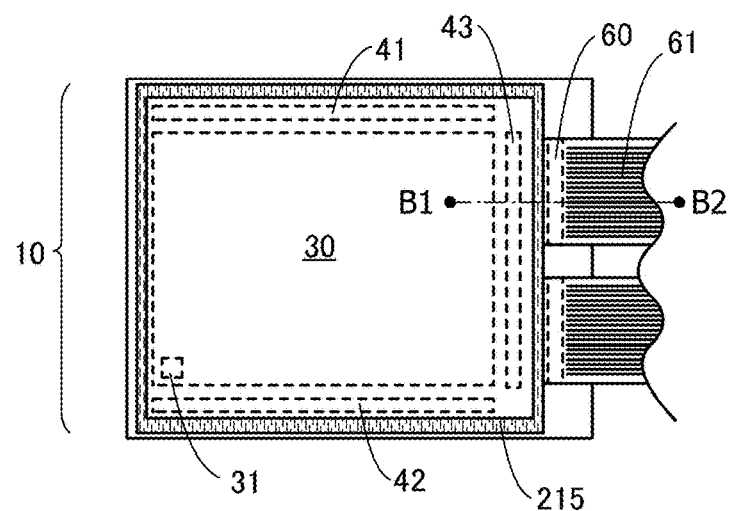
FIG. 1 is a plan view illustrating a structure example of a liquid crystal panel.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below.

Note that in the drawings used for the description of the embodiments of the invention, the same portions or portions having similar functions are denoted by the same reference numerals, and repeated description thereof is omitted in some cases.

Note that in this specification, the category of a liquid crystal display device includes a liquid crystal panel in which liquid crystal elements are formed in respective pixels, and a module in which an IC or the like including a driver circuit or a controller and a light source such as a backlight or a frontlight are mounted on the liquid crystal panel.

(Embodiment 1)
<Structure of Liquid Crystal Panel>

Figure 2:
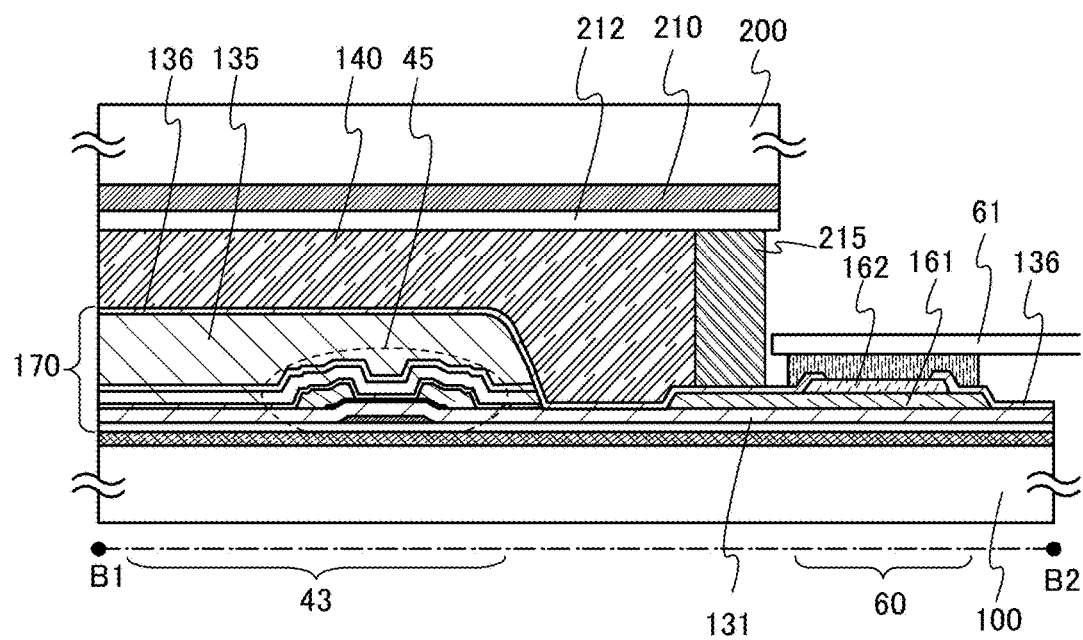
FIG. 2 is a cross-sectional view illustrating a structure example of the liquid crystal panel, taken along line B1-B2 in FIG. 1.

A liquid crystal panel of this embodiment is described using FIG. 1, FIG. 2, FIG. 3, FIG. 4, FIG. 5, FIG. 14, and FIG. 23. FIG. 1 is a plan view illustrating an example of a structure of a liquid crystal panel 10. FIG. 2 is a cross-sectional view illustrating an example of a structure of the liquid crystal panel 10 and corresponds to a cross-sectional view taken along line B1-B2 in FIG. 1.

Figure 14:
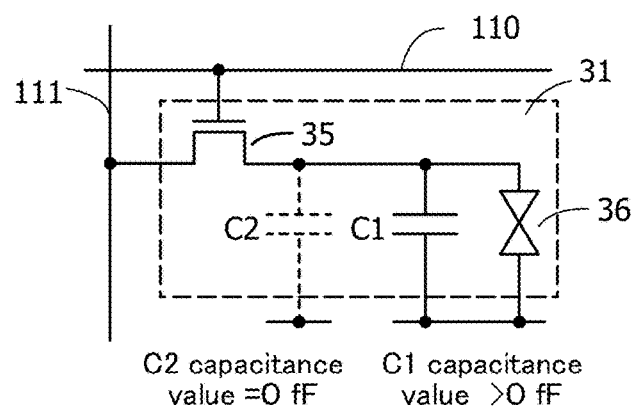
FIG. 14 is a circuit diagram illustrating a configuration example of a pixel.
Figure 23:
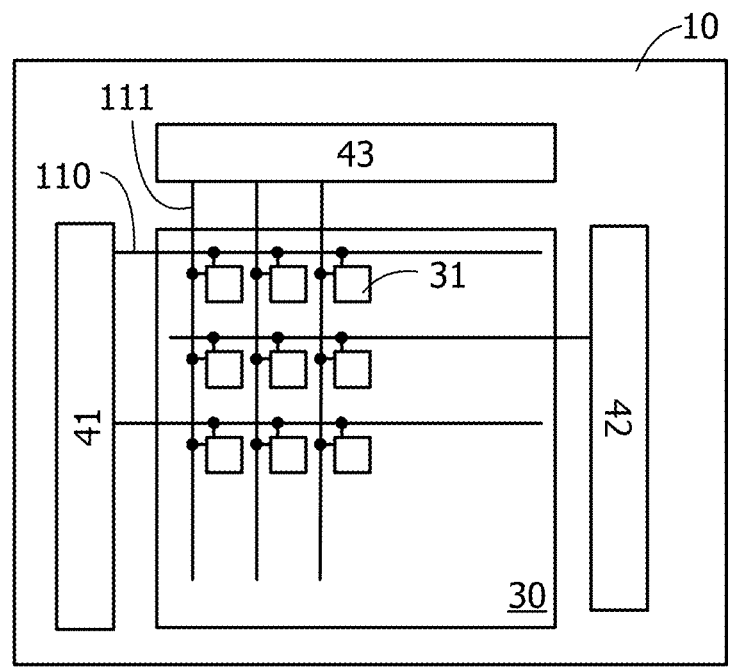
FIG. 23 is a block diagram illustrating a structure example of a liquid crystal display device including a liquid crystal panel.

FIG. 23 is a block diagram illustrating an example of a structure of the liquid crystal panel 10. The liquid crystal panel 10 includes a display portion 30, a scan line driver circuit 41, a scan line driver circuit 42, and a data line driver circuit 43. The display portion 30 includes a plurality of pixels 31 connected to scan lines 110 and data lines 111. FIG. 14 is a circuit diagram illustrating a configuration example of the pixel 31.

The pixel 31 includes a transistor 35 and a liquid crystal element 36. The transistor 35 is a switching element which controls an electrical connection between the liquid crystal element 36 and the data line 111. The transistor 35 is turned on or off by a scan signal input from its gate through the scan line 110.

Figure 3:
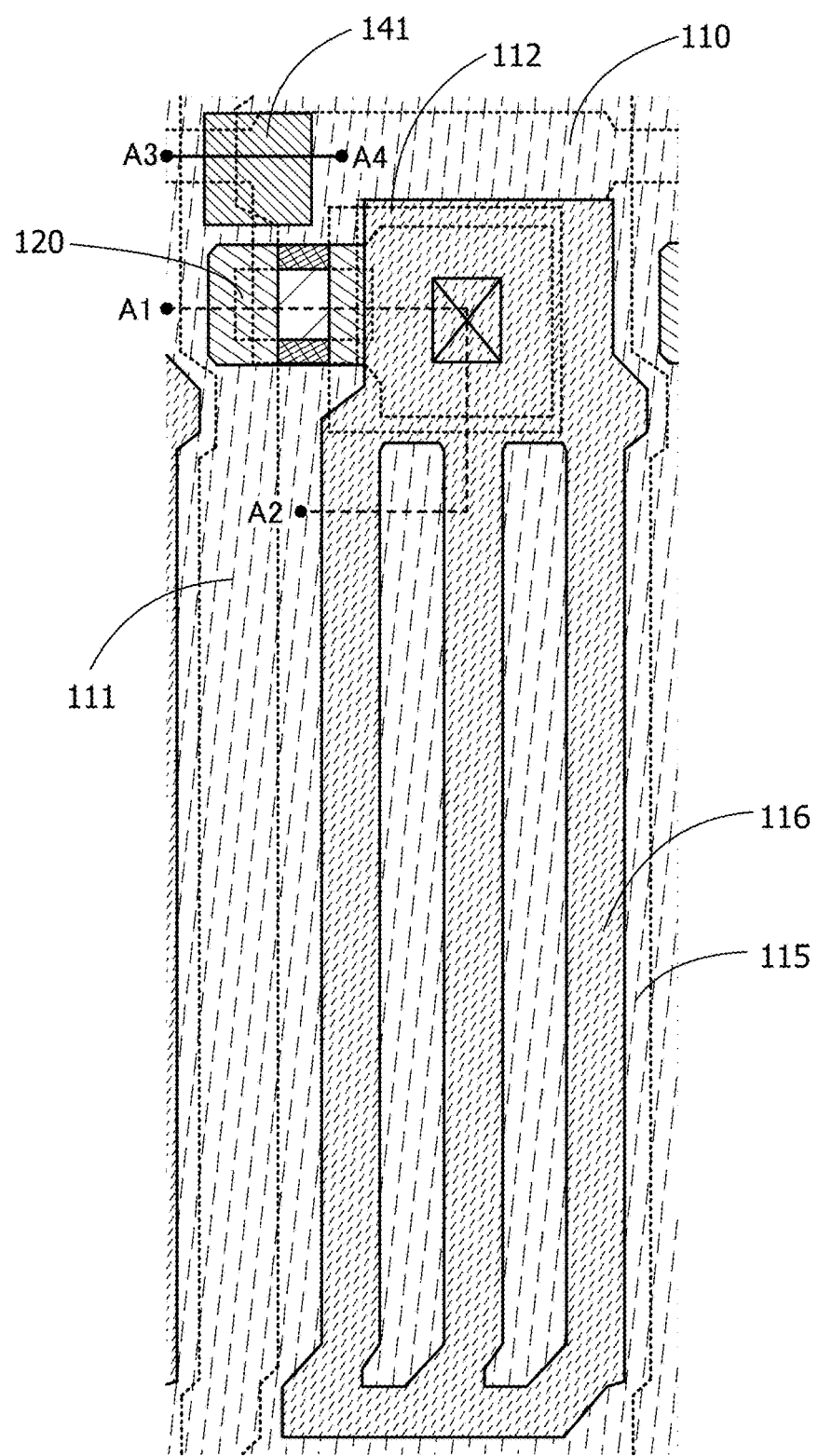
FIG. 3 is a plan view illustrating a structure example of a pixel.
Figure 4:
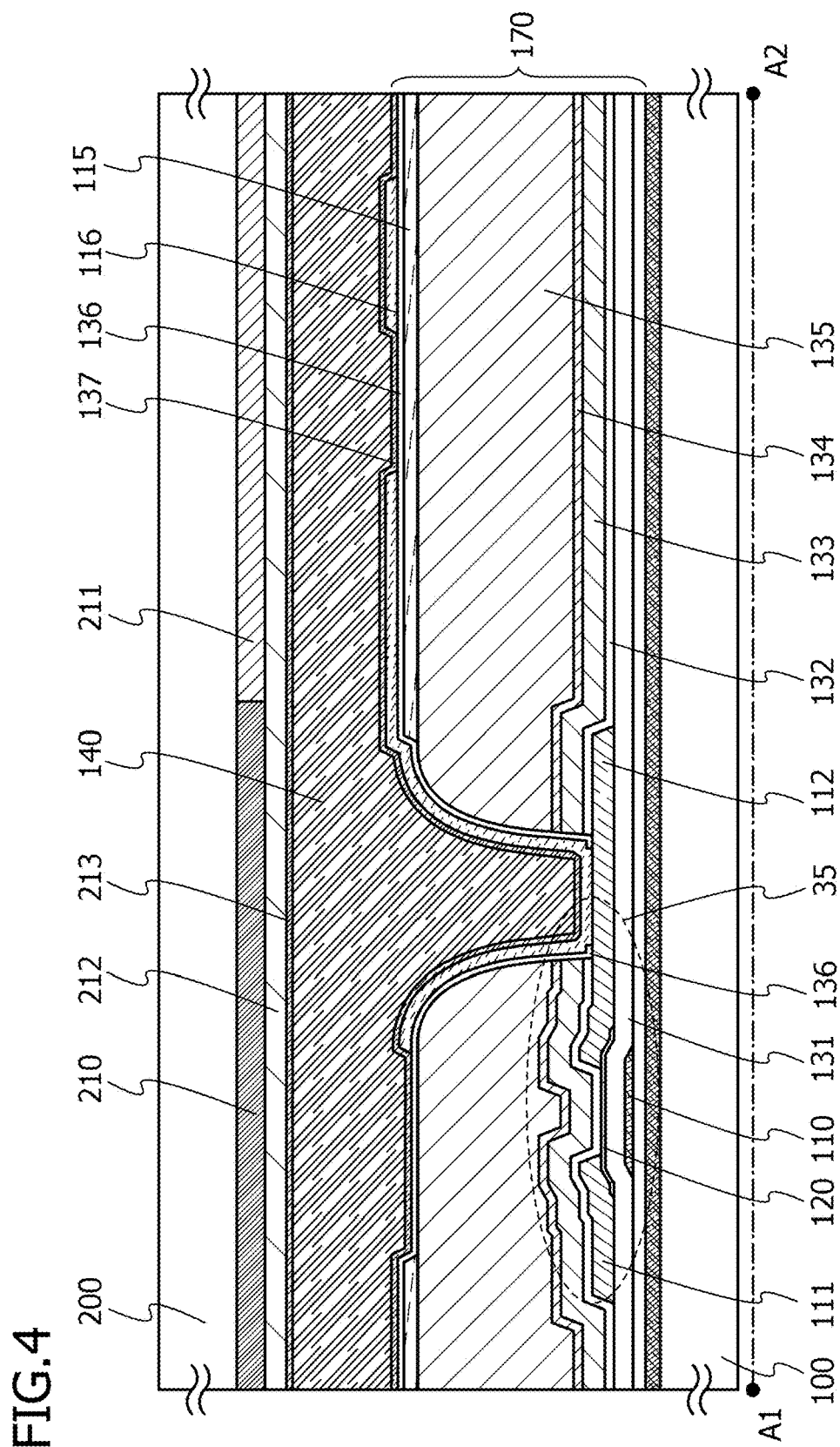
FIG. 4 is a cross-sectional view of the pixel taken along line A1-A2 in FIG. 3.
Figure 5:
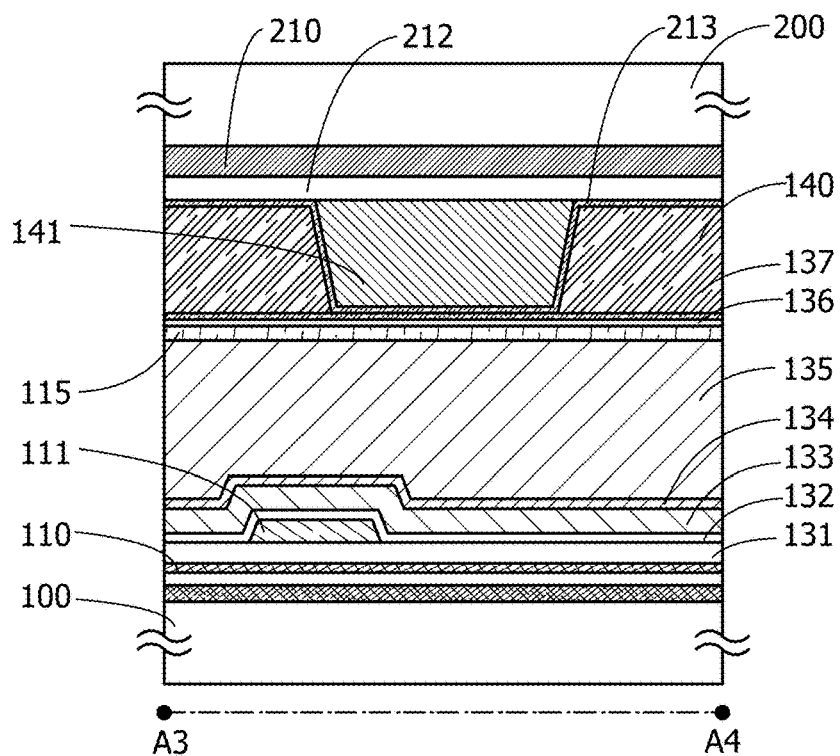
FIG. 5 is a cross-sectional view of the pixel taken along line A3-A4 in FIG. 3.

FIG. 3 is a plan view illustrating a structure example of the pixel 31. FIG. 4 is a cross-sectional view illustrating a structure example of the pixel 31 taken along line A1-A2 in FIG. 3. FIG. 5 is a cross-sectional view illustrating a structure example of the pixel 31 taken along line A3-A4 in FIG. 3. Here, although the pixel 31 of an FFS mode is used in the liquid crystal panel 10, the pixel 31 of an IPS mode may be used.

The display portion 30, the scan line driver circuit 41, the scan line driver circuit 42, and the data line driver circuit 43 each include a transistor including an oxide semiconductor. FIG. 2 illustrates a transistor 45 in the data line driver circuit 43, and FIG. 4 illustrates the transistor 35 in the pixel 31. In the display portion 30, the scan line driver circuit 41, the scan line driver circuit 42, and the data line driver circuit 43, transistors having the same structure are formed. Here, as the transistors in the display portion 30, the scan line driver circuit 41, the scan line driver circuit 42, and the data line driver circuit 43, bottom-gate transistors including an oxide semiconductor film as a semiconductor layer are used.

The scan lines 110 of odd-numbered rows are connected to one of the scan line driver circuits 41 and 42 and the scan lines 110 of even-numbered rows are connected to the other of the scan line driver circuits 41 and 42. The data lines 111 are connected to the data line driver circuit 43. The transistor 35 in the pixel 31 is connected to the scan line 110 and the data line 111.

In the liquid crystal panel 10, a liquid crystal layer 140 sealed by a sealing member 215 is provided between the substrate 100 and the substrate 200. The cell gap of the liquid crystal panel 10 is maintained by a spacer 141 formed over the substrate 200 (see FIG. 5). As illustrated in FIG. 3 and FIG. 5, the spacer 141 is formed in a region where the scan line 110 and the data line 111 overlap with each other. Such a region does not contribute to display because it is a region where the alignment of the liquid crystal material is disordered. When the spacer 141 is formed in such a region, the aperture ratio of the pixel 31 can be increased to 50% or more.

Over the substrate 100, a terminal portion 60 connected to an FPC 61 is formed outside the sealing member 215. In an upper layer of the terminal portion 60, an electrode 162 is formed using the same transparent conductive film as a common electrode 115, and the FPC 61 and the electrode 162 are electrically connected to each other through an anisotropic conductive film. The electrode 162 is electrically connected to the display portion 30, the scan line driver circuit 41, the scan line driver circuit 42, and the data line driver circuit 43 and is formed using a conductive film forming the data line 111. Note that a wiring 161 connecting the electrode 162 to the display portion 30, the scan line driver circuit 41, the scan line driver circuit 42, and the data line driver circuit 43 can be formed using the same conductive film as the scan line 110.

Each of the substrates 100 and 200 is flexible and can be a substrate of a resin such as plastic. Examples of a plastic substrate include polyester typified by polyethylene terephthalate (PET), polyethersulfone (PES), polyethylene naphthalate (PEN), polycarbonate (PC), a polyamide synthetic fiber, polyetheretherketone (PEEK), polysulfone (PSF), polyetherimide (PEI), polyarylate (PAR), polybutylene terephthalate (PBT), polyimide, an acrylonitrile butadiene styrene resin, polyvinyl chloride, polypropylene, polyvinyl acetate, an acrylic resin, and the like.

Further, in the substrate 100 or 200, at least one of a pair of flat surfaces may have an insulating property and be covered with a ceramic layer having a property of transmitting visible light. Although a substrate formed using a resin tends to have a lower resistance to physical impact which causes damage than a glass substrate or the like, the substrate 100 or 200 covered with a ceramic layer having the above properties can be hardly damaged on its surface while maintaining a property of transmitting visible light. As a ceramic layer, it is preferable to use any of a metal oxide, a metal nitride, a metal carbide, a metal arsenide, a metal sulphide, a silicon oxide, and a silicon carbide which have a property of transmitting visible light and an insulating property. Specifically, for the ceramic layer, it is possible to use titanium oxide, aluminum oxide, chromium oxide, magnesium oxide, nickel oxide, zirconium oxide, silicon nitride, aluminum nitride, titanium oxynitride, silicon carbide, silicon oxynitride, or the like.

The ceramic layer can be formed by a sol-gel method, an evaporation method, a CVD method, a sputtering method, or the like. Alternatively, the ceramic layer may be formed over the substrate 100 or 200 in such a manner that a ceramic layer is formed over a substrate having high heat resistance by any of the above methods, separated from the substrate having high heat resistance, and then transferred to the substrate 100 or 200. Further alternatively, ceramic particles together with a gas are blown to the substrate 100 or 200 at high speed, so that the ceramic layer can be formed over the substrate 100 or 200.

<Pixel>

In the pixel 31, over an organic resin film 135, the common electrode 115 and a pixel electrode 116 face each other with an insulating film 136 provided therebetween. The common electrode 115 is formed as one electrode in the display portion 30, and in each of the pixels 31, an opening is formed in a connection portion between the pixel electrode 116 and the transistor 35. The pixel electrode 116 is divided for each of the pixels 31, and the pixel electrode 116 included in each of the pixels 31 has a striped region. FIG. 3 illustrates the case where a slit-shaped opening is provided in the pixel electrode 116. The liquid crystal element 36 (see FIG. 14) in the pixel 31 includes the common electrode 115, the pixel electrode 116, and the liquid crystal layer 140.

Alignment of the liquid crystal material of the liquid crystal layer 140 is changed by the action of an electric field generated between the common electrode 115 and the pixel electrode 116.

Note that in the common electrode 115, a slit-shaped opening can be formed in a portion overlapping with the pixel electrode 116.

Further, a capacitor C1 is formed in a region where the pixel electrode 116 and the common electrode 115 overlap with each other with the insulating film 136 provided therebetween (see FIG. 14). Thus, a capacitor C2 formed by additionally forming a wiring referred to as an auxiliary capacitor wiring in the pixel 31 is not necessary. In other words, as a storage capacitor of the liquid crystal element 36, the capacitor C1 (>0 fF) including the pixel electrode 116, the common electrode 115, and the insulating film 136 is provided and the capacitor C2 using the auxiliary capacitor wiring as an electrode is not provided. That is, the capacitance value of the capacitor C1 exceeds 0 (fF) and can be approximately several hundred (fF); on the other hand, that of the capacitor C2 is 0 (fF).

Thus, since an auxiliary capacitor wiring which decreases an aperture ratio is not formed in the pixel 31 and the capacitor C1 is provided in parallel to the liquid crystal element 36, the aperture ratio can be increased. The aperture ratio can be increased to 50% or greater, further 60% or greater.

Over the substrate 200, a black matrix 210, a color filter 211, an overcoat 212, and an alignment film 213 are formed. The color filter 211 is formed in a region overlapping with the pixel electrode 116, and the black matrix 210 is provided to cover a region which does not contribute to display and in which the scan line 110, the data line 111, and the like are formed.

Figure 6:
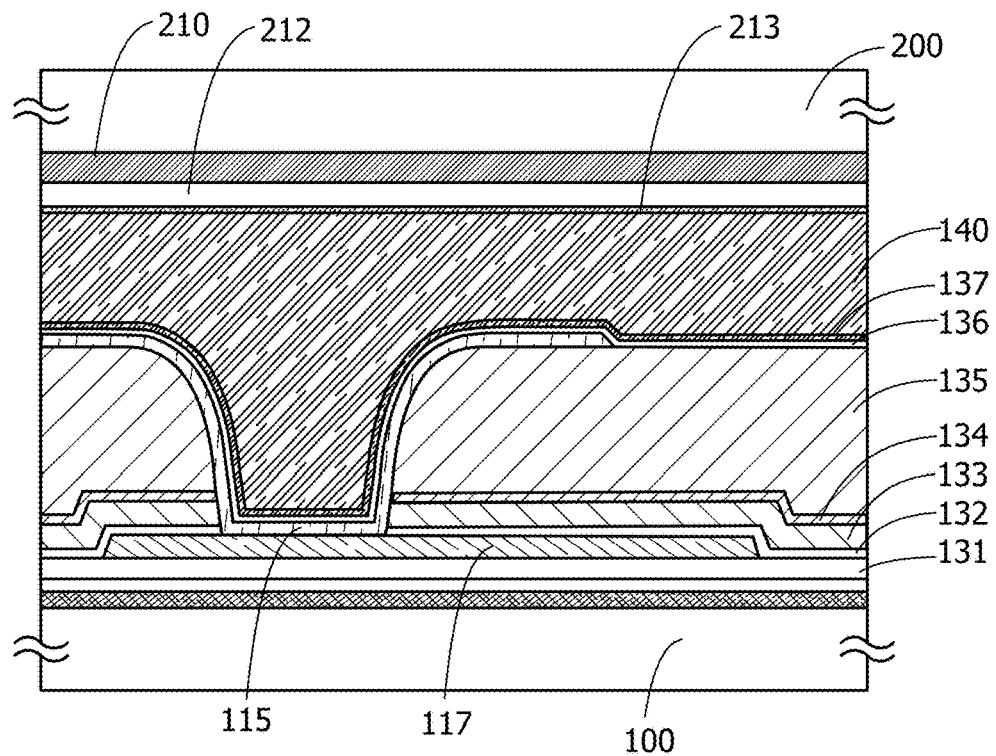
FIG. 6 is a cross-sectional view illustrating an example of a connection structure of a common electrode and a terminal portion.

As illustrated in FIG. 6, the common electrode 115 is electrically connected to a wiring 117 over an insulating film 131. The wiring 117 is formed outside the display portion 30 and is electrically connected to the electrode 162 in the terminal portion 60 in a manner similar to that of the wiring 161 in FIG. 2. With such a structure, a potential can be applied to the common electrode 115 from the outside of the liquid crystal panel 10.

An FFS-mode liquid crystal panel can have a wider viewing angle and higher contrast than an IPS-mode liquid crystal panel and can be driven at lower voltage than an IPS-mode one; thus, it is extremely preferable that by using a transistor including an oxide semiconductor, a high definition display device of a mobile electronic device can be obtained. In addition, in an FFS-mode liquid crystal panel, a pixel electrode and a common electrode overlap with each other; thus, a storage capacitor can be added to a pixel without providing a storage capacitor wiring, which enables the aperture ratio to be increased.

<Method for Manufacturing Transistor>

A method for manufacturing a circuit board of the liquid crystal panel 10 illustrated in FIG. 1 is described below.

First, a method for manufacturing transistors in the display portion 30, the scan line driver circuit 41, the scan line driver circuit 42, and the data line driver circuit 43 are described with reference to FIGS. 8A to 8D and FIGS. 9A to 9C. FIGS. 8A to 8D and FIGS. 9A to 9C are cross-sectional views illustrating an example of a method for manufacturing the transistor 35 in the display portion 30, and the transistors in the scan line driver circuit 41, the scan line driver circuit 42, and the data line driver circuit 43 which have the same structure are formed over a substrate 180 at the same time as the transistor 35.

Figure 8A:
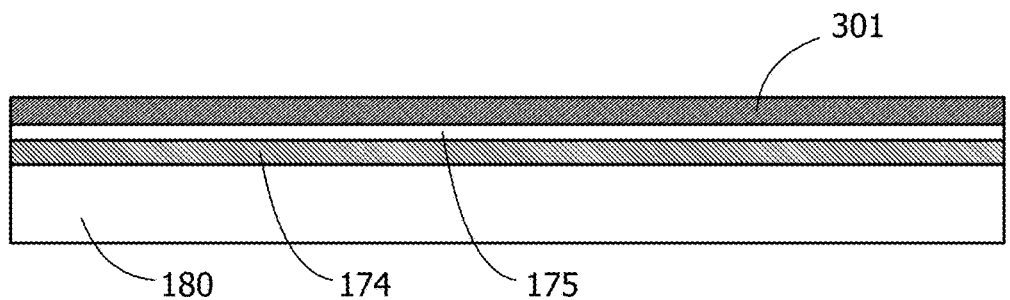
FIGS. 8A to 8D are cross-sectional views illustrating an example of a method for manufacturing a transistor.

As illustrated in FIG. 8A, a separation layer 174, an insulating film 175 over the separation layer 174, and a conductive film 301, which forms a wiring and an electrode in the first layer over the insulating film 175, are formed over the substrate 180.

As the substrate 180, a substrate having heat resistance high enough to withstand a later manufacturing step is preferable, and for example, a glass substrate, a ceramic substrate, a quartz substrate, a sapphire substrate, or the like is used.

As the separation layer 174, a metal film, a metal oxide film, or a film in which a metal film and a metal oxide film are stacked can be used. The metal film and the metal oxide film can be either a single layer or a stacked structure of a plurality of layers. Other than a metal film or a metal oxide film, a metal nitride film or a metal oxynitride film can also be used. The separation layer 174 can be formed by a sputtering method or a CVD method such as a plasma CVD method.

Examples of metals used for the separation layer 174 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like.

Other than such metal films, the separation layer 174 can also be formed using a film made of an alloy containing the above metal as a main component or a compound containing the above metal.

The separation layer 174 having a stack of a metal film and a metal oxide film can be formed by forming a base metal film and then, oxidizing or nitriding the surface of the metal film. Specifically, plasma treatment may be performed on the base metal film in an oxygen atmosphere or an $N_2O$ atmosphere, or heat treatment may be performed on the base metal film in an oxygen atmosphere or an $N_2O$ atmosphere. Alternatively, the metal film can be oxidized by forming a silicon oxide film or a silicon oxynitride film so as to be in contact with the base metal film. Further alternatively, the metal film can be nitrided by forming a silicon oxynitride film or a silicon nitride film so as to be in contact with the base metal film.

As the plasma treatment which oxidizes or nitrides a metal film, high-density plasma treatment in which a plasma density is greater than or equal to $1\times10^{11}$ cm$^{-3}$, preferably in the range of $1\times10^{11}$ cm$^{-3}$ to $9\times10^{15}$ cm$^{-3}$ and which uses a high frequency wave such as a microwave (for example, a frequency is 2.45 GHz) may be performed.

Note that the separation layer 174 in which a metal film and a metal oxide film are stacked may be formed by oxidizing a surface of the base metal film; however, a metal oxide film may be separately formed after a metal film has been formed. In the case of using tungsten as a metal, for example, a tungsten film is formed as the base metal film by a sputtering method, a CVD method, or the like, and then the tungsten film is subjected to plasma treatment. Accordingly, the tungsten film corresponding to the metal film and a metal oxide film which is in contact with the metal film and formed of an oxide of tungsten can be formed.

The insulating film 175 is formed using an insulating material such as silicon oxide, silicon nitride, silicon oxynitride, or silicon nitride oxide by a CVD method, a sputtering method, or the like.

The insulating film 175 is provided in order that alkali metal such as Na or alkaline earth metal contained in the substrate 180 can be prevented from diffusing into a semiconductor layer 120 formed later and adversely affecting characteristics of a semiconductor element such as the transistor. In addition, the insulating film 175 has a function of preventing an impurity element contained in the separation layer 174 from diffusing into the semiconductor layer 120, and also has a function of protecting an element layer 170 in a later step of separating the element layer 170. Furthermore, with the insulating film 175, the separation layer 174 can be easily separated or a semiconductor element or a wiring can be prevented from being cracked or damaged in the later separation step.

The insulating film 175 may be a single insulating film or a stack of a plurality of insulating films. In this embodiment, the insulating film 175 is formed by sequentially stacking a 100-nm-thick silicon oxynitride film, a 50-nm-thick silicon nitride oxide film, and a 100-nm-thick silicon oxynitride film. However, the material and the thickness of each film, and the number of stacked films are not limited to them.

Although the case where the separation layer 174 is formed directly over the substrate 180 is described in this embodiment, an insulating film including silicon oxide, silicon nitride, silicon oxynitride, silicon nitride oxide, or the like may be formed between the substrate 180 and the separation layer 174 in order to increase adhesion between the substrate 180 and the separation layer 174.

As the conductive film 301, a single layer or two or more layers of a film including a conductive material containing one or more kinds of aluminum, titanium, chromium, cobalt, nickel, copper, yttrium, zirconium, molybdenum, ruthenium, silver, tantalum, and tungsten are preferably formed. For example, as the conductive film 301, a film in which a copper film is stacked over a tungsten nitride film or a single layer film of tungsten can be formed.

Figure 8B:
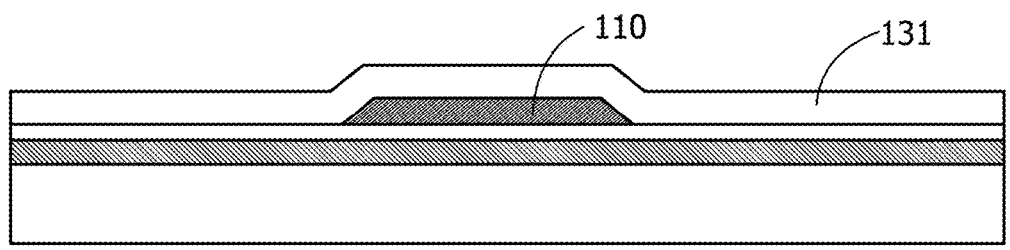

Next, the scan line 110 which also serves as a gate electrode of the transistor is formed by a photolithography process and an etching step. A mask formed of a resist (hereinafter referred to as a resist mask) is formed over the conductive film 301 by using a first photomask and then the conductive film 301 is etched, so that the scan line 110 is formed. Then, the resist mask is removed (FIG. 8B).

Figure 7:
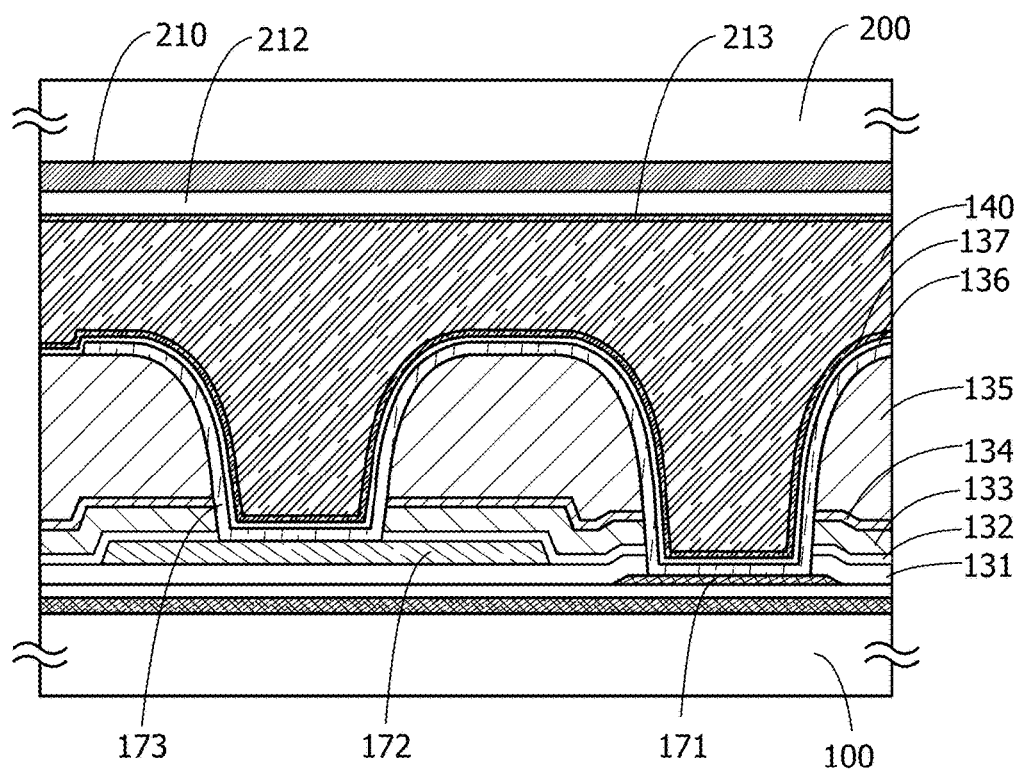
FIG. 7 is a cross-sectional view illustrating an example of a connection structure of wirings (electrodes) of a liquid crystal panel.

As illustrated in FIG. 7, an electrode 171 is formed together with the scan line 110. FIG. 7 is a cross-sectional view illustrating an example of a connection structure of wirings (electrodes) formed outside the display portion 30 and illustrates a structure in which the electrode 171 in the first layer and an electrode 172 in the second layer are connected to each other through an electrode 173. Such a connection structure is applied to the scan line driver circuit 41, the scan line driver circuit 42, the data line driver circuit 43, a lead wiring, and the like.

Figure 8C:
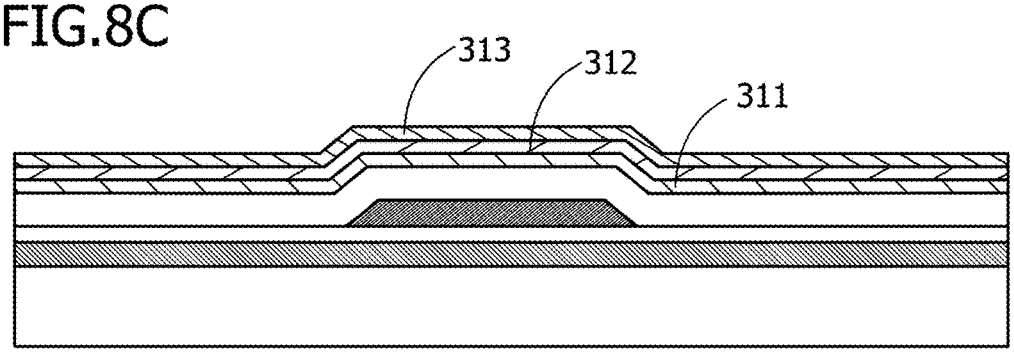

The insulating film 131 is formed to cover the scan line 110 (the wiring and the electrode in the first layer), and a three-layer stack of oxide semiconductor films 311 to 313 is formed over the insulating film 131 (FIG. 8C).

The insulating film 131 serves as a gate insulating film of the transistor 35. The insulating film 131 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, in the case of using the insulating film 131 having a two-layer structure, a multilayer film including a silicon nitride film as the first layer and a silicon oxide film as the second layer may be used. The silicon oxide film in the second layer can be a silicon oxynitride film. The silicon nitride film in the first layer can be replaced with a silicon nitride oxide film.

As the silicon oxide film, a silicon oxide film with a low defect density is preferably used. Specifically, a silicon oxide film which has a spin density of $3\times10^{17}$ spins/cm$^3$ or less, preferably $5\times10^{16}$ spins/cm$^3$ or less corresponding to a signal at a g-factor of 2.001 in electron spin resonance (ESR) is used. As the silicon oxide film, a silicon oxide film having excess oxygen is preferably used. As the silicon nitride film, a silicon nitride film from which hydrogen and ammonia are less released is used. The amount of released hydrogen and ammonia is preferably measured by thermal desorption spectroscopy (TDS) analysis.

Note that silicon nitride oxide refers to an insulating material that contains more nitrogen than oxygen, whereas silicon oxynitride refers to an insulating material that contains more oxygen than nitrogen.

The three-layer stack of the oxide semiconductor films 311 to 313 forms the semiconductor layer 120 in the transistor. Although the three-layer stack of the oxide semiconductor films (311 to 313) is formed here (FIG. 8C), a single-layer structure or another stacked-layer structure may be employed.

Figure 8D:
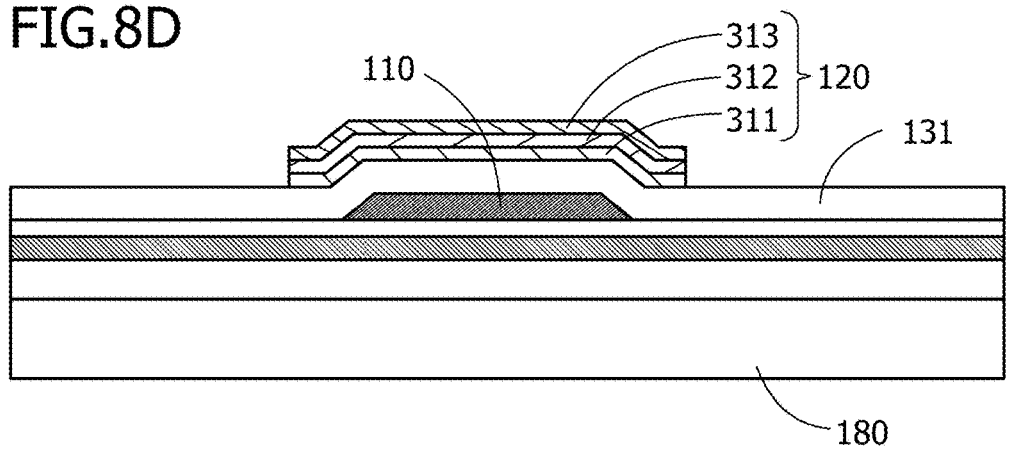

Next, the semiconductor layer 120 of the transistor is formed by a photolithography process and an etching step. A resist mask is formed over the oxide semiconductor film 311 by using a second photomask and then the oxide semiconductor films 311 to 313 are etched, so that the semiconductor layer 120 is formed. Then, the resist mask is removed (FIG. 8D).

As the oxide semiconductor used for the semiconductor layer 120 of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or any of oxides whose composition is in the neighborhood of the above compositions can be used.

When the oxide semiconductor film forming the semiconductor layer 120 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}$/cm$^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current when the transistor including an oxide semiconductor film is in an off state can be less than or equal to $1\times10^{-18}$ A, preferably less than or equal to $1\times10^{-21}$ A, more preferably less than or equal to $1\times10^{-24}$ A at room temperature (approximately 25° C.), or the drain current can be less than or equal to $1\times10^{-15}$ A, preferably less than or equal to $1\times10^{-18}$ A, more preferably less than or equal to $1\times10^{-21}$ A at 85° C. Note that an off state of a transistor refers to a state where gate voltage is sufficiently lower than threshold voltage in the case of an n-channel transistor. Specifically, when the gate voltage is lower than the threshold voltage by 1 V or more, 2 V or more, or 3 V or more, the transistor is turned off.

Note that in an FFS-mode liquid crystal display device, the capacitor C1 illustrated in FIG. 14 is formed in a region where the pixel electrode 116 and the common electrode 115 overlap with each other with the insulating film 136 provided therebetween. Thus, when the thickness and the relative permittivity of the insulating film 136 are not changed, as the area of the region increases, the capacitance of the capacitor C1 becomes higher; on the other hand, as the area of the region decreases, the capacitance of the capacitor C1 becomes lower. Further, in a liquid crystal display device of one embodiment of the present invention, the off-state current of the transistor 35 can be extremely small; thus, the amount of charge leaked from the capacitor C1 can be smaller than that in a liquid crystal display device in which a transistor using silicon is used as a switching element in a pixel. Therefore, in the liquid crystal display device of one embodiment of the present invention, the capacitance of the capacitor C1 can be smaller than that in a liquid crystal display device in which a transistor using silicon is used as a switching element in a pixel, and the area of the region where the pixel electrode 116 and the common electrode 115 overlap with each other with the insulating film 136 provided therebetween can be reduced. As a result, in the liquid crystal display device of one embodiment of the present invention, the transmittance of the pixel 31 can be increased, so that the amount of light lost in the liquid crystal panel is reduced; thus, power consumption of the liquid crystal display device can be reduced.

Here, the oxide semiconductor films 311 to 313 are provided so that a channel of the transistor is formed in mainly the oxide semiconductor film 312 of the semiconductor layer 120. The method for manufacturing the oxide semiconductor films 311 to 313 is described in detail later.

Figure 9A:
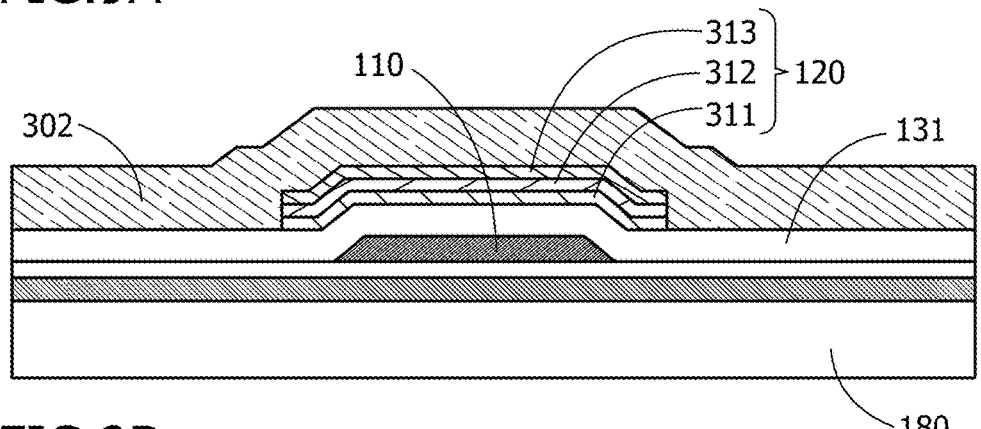
FIGS. 9A to 9C are cross-sectional views illustrating an example of steps following the step in FIG. 8D.

As illustrated in FIG. 9A, a conductive film 302 forming a wiring and an electrode in the second layer is formed over the entire area of the substrate 180. The conductive film 302 can be formed in a manner similar to that of the conductive film 301. Here, the conductive film 302 has a three-layer structure. Titanium films are formed as the first and third layers and an aluminum film is formed as the second layer. The titanium films and the aluminum film are formed by a sputtering method.

Figure 9B:
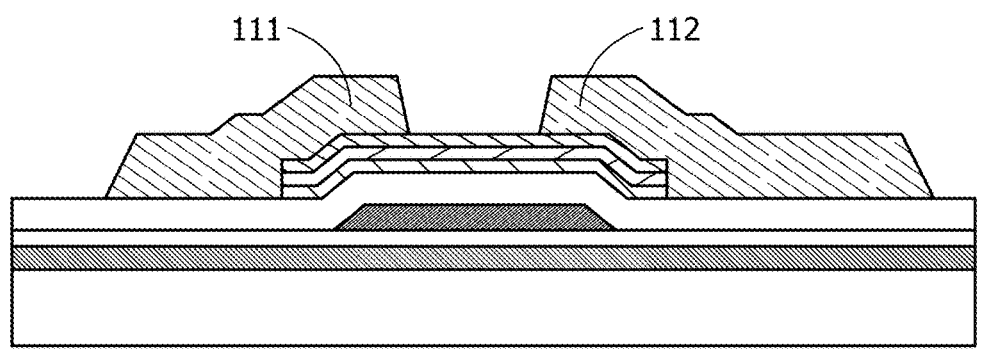

Next, a resist mask is formed over the conductive film 302 and the insulating film 131 by using a third photomask. The conductive film 302 is etched using this resist mask, so that the data line 111 connected to the semiconductor layer 120 and an electrode 112 are formed (FIG. 9B). The data line 111 and the electrode 112 serve as a source electrode and a drain electrode of the transistor.

Further, the wiring 161 in FIG. 2, the wiring 117 in FIG. 6, the electrode 172 in FIG. 7, and the like which are in the second layer are formed using the conductive film 302. The wiring 117 in FIG. 6 is a lead wiring for connecting the common electrode 115 to the terminal portion 60.

Figure 9C:
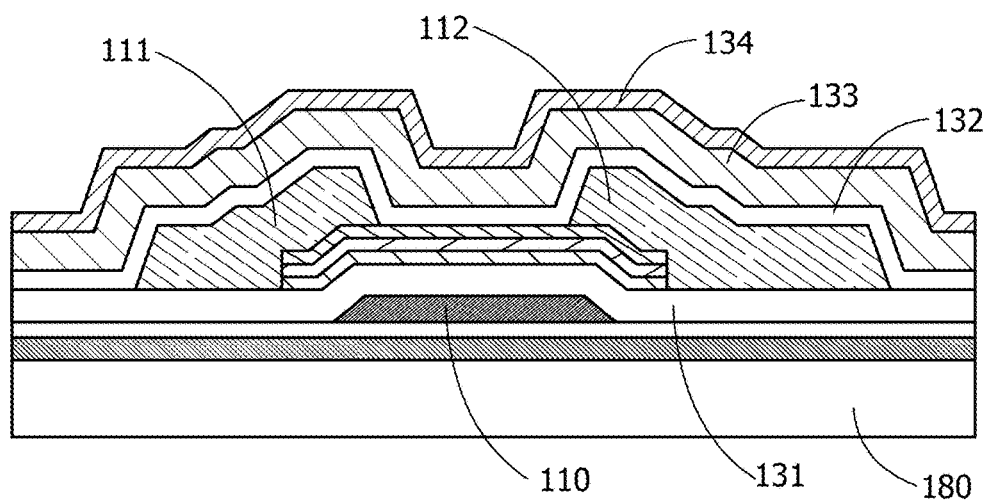

Next, an inorganic insulating film is formed so as to cover the entire area of the substrate 180. Here, a stack of insulating films 132 to 134 formed using inorganic insulating materials is formed (FIG. 9C). It is particularly preferable that the insulating films 132 and 133 be oxide films and the insulating film 134 be a nitride insulating film. The use of a nitride insulating film as the insulating film 134 can suppress entry of impurities such as hydrogen and water into the semiconductor layer of the transistor from the outside. Note that the insulating film 132 is not necessarily provided.

Further, in the case where one or both of the insulating films 132 and 133 are oxide films, the oxide film in which the oxygen content is higher than that in the stoichiometric composition is preferably used. In that case, oxygen can be prevented from being released from the oxide semiconductor films 311 to 313, and the oxygen contained in an oxygen excess region can be transferred to the oxide semiconductor film to fill oxygen vacancies.

For example, when an oxide insulating film having the feature described below is used, the oxygen vacancies in the oxide semiconductor film can be filled. The feature of the oxide insulating film is that the number of oxygen molecules released from the oxide insulating film is greater than or equal to $1.0\times10^{18}$ molecules/cm$^3$ when measured by thermal desorption spectroscopy (hereinafter referred to as TDS). Note that a region in which the oxygen content is higher than that in the stoichiometric composition (oxygen excess region) may be partly included in one or both of the insulating films 132 and 133. When such an oxygen excess region is present in a region overlapping with at least the semiconductor layer 120 including the oxide semiconductor films 311 to 313, oxygen is prevented from being released from the oxide semiconductor films 311 to 313 and the oxygen contained in the oxygen excess region can be transferred to the oxide semiconductor films 311 to 313 to fill oxygen vacancies.

In the case where the insulating film 133 is an oxide film in which the oxygen content is higher than that in the stoichiometric composition, the insulating film 132 is preferably an oxide film which penetrates oxygen. Oxygen which enters the insulating film 132 from the outside partly remains in the insulating film 132. Further, oxygen which is contained in the insulating film 132 from the first is released from the insulating film 132 to the outside in some cases. Thus, the insulating film 132 is preferably an oxide insulating film having a high coefficient of diffusion of oxygen.

The thickness of the insulating film 132 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 131 can be greater than or equal to 30 nm and less than or equal to 500 nm, preferably greater than or equal to 150 nm and less than or equal to 400 nm.

In the case where a nitride insulating film is used as the insulating film 134, an insulating film having a barrier property against nitrogen is preferably used as one or both of the insulating films 132 and 133. For example, a dense oxide insulating film can have a barrier property against nitrogen. Specifically, an oxide insulating film which can be etched at a rate less than or equal to 10 nm per minute when the temperature is 25° C. and 0.5 wt % of fluoric acid is used is preferably used.

In the case where an oxide insulating film containing nitrogen, such as a silicon oxynitride film or a silicon nitride oxide film, is used as one or both of the insulating films 132 and 133, the nitrogen concentration measured by secondary ion mass spectrometry (SIMS) is preferably higher than or equal to the lower limit of measurement by SIMS and lower than $3 \times 10^{20}$ atoms/cm$^3$, more preferably higher than or equal to $1 \times 10^{18}$ atoms/cm$^3$ and lower than or equal to $1 \times 10^{20}$ atoms/cm$^3$. In that case, the amount of nitrogen which enters the semiconductor layer 120 containing the oxide semiconductor included in the transistor 35 can be reduced and the number of defects in the nitrogen-containing oxide insulating film itself can be reduced.

The insulating film 132 can be formed under the following conditions. The substrate placed in a treatment chamber of a PECVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, and silane fluoride. As the oxidizing gas, oxygen, ozone, dinitrogen monoxide, and nitrogen dioxide can be given as examples.

As the insulating film 134, a nitride insulating film with a low hydrogen content may be provided. The nitride insulating film is as follows, for example: the number of hydrogen molecules released from the nitride insulating film is less than $5.0 \times 10^{21}$ molecules/cm$^3$, preferably less than $3.0 \times 10^{21}$ molecules/cm$^3$, more preferably less than $1.0 \times 10^{21}$ molecules/cm$^3$ when measured by TDS.

The insulating film 134 has a thickness large enough to prevent entry of impurities such as hydrogen and water into the transistor from the outside. For example, the thickness can be greater than or equal to 50 nm and less than or equal to 200 nm, preferably greater than or equal to 50 nm and less than or equal to 150 nm, and further preferably greater than or equal to 50 nm and less than or equal to 100 nm.

The insulating films 132 to 134 can be formed by any of a variety of deposition methods such as a PECVD method and a sputtering method. It is preferable that the insulating films 132 to 134 be formed in succession in a vacuum. In such a case, entry of impurities into each interface can be suppressed. In the case where the materials used for the insulating film 132 and the insulating film 133 have the same composition, the interface between the insulating film 132 and the insulating film 133 cannot be clearly observed in some cases.

For example, as the insulating film 132, a silicon oxide film or a silicon oxynitride film can be formed by a PECVD method under the following formation conditions. The substrate is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 132 can be reduced and dangling bonds in the insulating film 132 can be reduced. Oxygen released from the insulating film 133 is captured by the dangling bonds in the insulating film 132 in some cases; thus, in the case where the dangling bonds in the insulating film 132 are reduced, oxygen in the insulating film 133 can enter the semiconductor layer 120 efficiently to fill the oxygen vacancies in the semiconductor layer 120. As a result, the amount of hydrogen entering the semiconductor layer 120 can be reduced and oxygen vacancies in the oxide semiconductor film can be reduced.

In the case where a silicon oxide film or a silicon oxynitride film is formed using a PECVD apparatus as the insulating film 133, the following formation conditions enables the oxygen concentration in the insulating film 133 to be increased. The source gases of the insulating films 131 and 133 are similar to that of the insulating film 132.

The substrate is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

During the formation of the insulating film 133, the high-frequency power having the density in the above range is supplied, whereby the decomposition efficiency of the source gas in plasma is increased, oxygen radicals are increased, and oxidation of the source gas proceeds; therefore, the oxygen content in the insulating film 133 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. The insulating film 132 is provided over the semiconductor layer 120. Accordingly, in the process for forming the insulating film 133, the insulating film 132 serves as a protective film of the semiconductor layer 120. Thus, even when the insulating film 133 is formed using the high-frequency power having a high power density, damage to the semiconductor layer 120 is not significant.

By increasing the thickness of the insulating film 133, a larger amount of oxygen is released by heating; thus, the insulating film 133 is preferably formed thicker than the insulating film 132. Since the insulating film 132 is provided, favorable coverage can be achieved even when the insulating film 133 is formed thick.

For example, in the case where a silicon nitride film with a low hydrogen content is formed by a PECVD apparatus as the insulating film 134, the insulating film 134 can be formed under the following formation conditions. The substrate is held at a temperature higher than or equal to 80° C. and lower than or equal to 400° C., preferably higher than or equal to 200° C. and lower than or equal to 370° C., a source gas is introduced into the treatment chamber, the pressure is greater than or equal to 100 Pa and less than or equal to 250 Pa, preferably greater than or equal to 100 Pa and less than or equal to 200 Pa, and high-frequency power is supplied to an electrode provided in the treatment chamber.

As the source gas of the insulating film 134, a deposition gas containing silicon, a nitrogen gas, and an ammonia gas are preferably used. Typical examples of the deposition gas containing silicon include silane, disilane, trisilane, silane fluoride, and the like. Further, the flow rate of nitrogen is preferably 5 times to 50 times that of ammonia, further preferably 10 times to 50 times that of ammonia. The use of ammonia as the source gas can facilitate decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

It is preferable that heat treatment be performed at least after formation of the insulating film 133 so that excess oxygen contained in the insulating film 132 or the insulating film 133 enters the semiconductor layer 120 to fill oxygen vacancies in the semiconductor layer 120. The heat treatment can be performed as heat treatment for dehydration or dehydrogenation of the semiconductor layer 120.

Through the above steps, the transistors in the pixel 31, the scan line driver circuit 41, the scan line driver circuit 42, and the data line driver circuit 43 in the liquid crystal panel can be manufactured.

<Manufacture of Pixel Electrode and Common Electrode>

Next, steps of manufacturing the pixel electrode 116 and the common electrode 115 in the pixel 31 are described with reference to the element layer 170 in FIG. 3, FIG. 4, FIG. 5, and FIG. 6.

The organic resin film 135 is formed so as to cover the transistor. The organic resin film 135 is a base film of the common electrode 115 and the pixel electrode 116 and is formed as a planarization film for reducing unevenness due to the transistor, the wirings, and the like. For the organic resin film 135, an acrylic resin, a polyimide resin, or the like can be used.

A resist mask is formed over the organic resin film 135 by using a fourth photomask. By an etching step using this resist mask, a contact hole is formed through the insulating films 131 to 134 using inorganic materials and the organic resin film 135. The contact hole formed here is used to connect the wiring or electrode in the second layer over the insulating film 131 to an electrode formed over the organic resin film 135. For example, a contact hole for connecting the common electrode 115 to the wiring 117 over the insulating film 131 is also formed (see FIG. 6).

Although one more photomask is needed, a photomask for forming a contact hole in the organic resin film 135 and a photomask for forming a contact hole in the insulating films 131 to 134 can be used separately.

Next, a transparent conductive film is formed over the organic resin film 135. A resist mask is formed over the transparent conductive film by using a fifth photomask. The transparent conductive film is etched using this resist mask, so that the common electrode 115 is formed. Further, the electrode 162 in the terminal portion 60 in FIG. 2, the electrode 173 in FIG. 7, and the like are formed using the transparent conductive film.

As illustrated in FIG. 7, the electrode 171 in the first layer and the electrode 172 in the second layer are connected to each other through the electrode 173 in the third layer.

In the case where the electrode 171 and the electrode 172 are connected to each other through the electrode 173 in the third layer as illustrated in FIG. 7, the number of photomasks can be reduced by one as compared to that in the case where a connection portion where the electrode 171 and the electrode 172 are directly connected to each other is formed. This is because a photomask for forming a contact hole in the insulating film 131 is needed before the conductive film 302 is formed in order to form a connection portion where the electrode 171 and the electrode 172 are directly connected to each other; on the other hand, the photomask is unnecessary in manufacture of the connection portion in FIG. 7.

The insulating film 136 is formed over the entire area of the substrate 180 so as to cover the common electrode 115. The insulating film 136 is formed as a passivation film for preventing entry of an impurity such as water from the outside. Further, the insulating film 136 forms a dielectric of the capacitor formed in the region where the common electrode 115 and the pixel electrode 116 overlap with each other. Like the insulating film 134, the insulating film 136 is preferably an insulating film of a nitride or a nitride oxide and for example, a silicon nitride film or a silicon nitride oxide film may be formed.

A resist mask is formed over the insulating film 136 by using a sixth photomask. The insulating film 136 is etched using this resist mask, so that at least a contact hole reaching the electrode 112 is formed.

A transparent conductive film is formed over the insulating film 136. A resist mask is formed over the transparent conductive film by using a seventh photomask. The transparent conductive film is etched using the resist mask, so that the pixel electrode 116 is formed. The pixel electrode 116 is connected to the electrode 112.

As the transparent conductive film forming the common electrode 115 and the pixel electrode 116, a film of an indium oxide containing tungsten oxide, an indium zinc oxide containing tungsten oxide, an indium oxide containing titanium oxide, an indium tin oxide containing titanium oxide, an indium tin oxide, an indium zinc oxide, an indium tin oxide to which silicon oxide is added, or the like can be used.

<Manufacture of Color Filter and Black Matrix>

Here, the black matrix 210, the color filter 211, the overcoat 212, and the spacer 141 are formed over the substrate 200. The black matrix 210 and the color filter 211 may be formed over the substrate 180. The spacer 141 may be formed, for example, by applying a photosensitive curable resin over the overcoat 212, exposing the resin to light through an eighth photomask, and performing development treatment. Note that the spacer 141 may be provided on the substrate 180 side.

<Cell Process>

A cell process is described below. The element layer 170 in which the display portion 30, the scan line driver circuit 41, the scan line driver circuit 42, the data line driver circuit 43, and the terminal portion 60 are formed is transferred to the substrate 100 (hereinafter referred to as a circuit board 100) and the circuit board 100 and the substrate 200 over which the color filter 211 and the like are formed (hereinafter referred to as a color filter substrate 200) are bonded to each other with a liquid crystal material sealed therebetween, whereby the liquid crystal panel 10 is manufactured.

Entry of water causes variation in threshold voltage or the like of a transistor including an oxide semiconductor, and accordingly, the reliability of the transistor is decreased. Therefore, as described above, in a manufacturing process of the circuit board 100, it is preferable to perform successive film formation and removal of an impurity (treatment for highly purifying the oxide semiconductor) of an oxide semiconductor, such as heat treatment for dehydrogenation. In view of this, also in the cell process, it is preferable not to take an impurity, particularly moisture, in the liquid crystal panel. Since providing desiccant or the like as in an organic EL panel is difficult in a liquid crystal panel due to the existence of a liquid crystal material, it is preferable not to take moisture in the liquid crystal panel in the cell process. Further, since an organic resin film has a higher hygroscopic property than an inorganic insulating film, the water concentration in the organic resin film 135 easily increases between formation of the organic resin film 135 and the cell process. Performing the cell process in a situation where the circuit board 100 or the color filter substrate 200 contains much moisture causes decrease in the reliability of the liquid crystal panel.

In view of the above, in the cell process, drying treatment for removing moisture from the substrate 180 over which the element layer 170 is formed or the color filter substrate 200 is performed, and the liquid crystal panel is manufactured in an atmosphere where moisture is not reattached. For example, the cell process is performed in an airtight treatment chamber. Further, heat treatment for removing moisture from the circuit board 100 and the color filter substrate 200 is performed at 100° C. or higher. The details of the cell process are described below.

<Formation of Alignment Film>

An alignment film 137 and the alignment film 213 are formed over the substrate 180 and the color filter substrate 200, respectively. After the substrate 180 is cleaned, a polyimide resin is applied over a surface of the substrate 180 by a printing method or the like to form the alignment film 137 and baked, so that the alignment film 137 is formed. Alignment treatment is performed on the alignment film 137 through rubbing or irradiation with light. The alignment film 213 is similarly formed over the color filter substrate 200. Although the above process can be performed in an air atmosphere, the following process is performed without exposure to the air in an airtight treatment chamber. The dew point of each treatment chamber is set to lower than or equal to −60° C., preferably lower than or equal to −75° C. For example, the dew point is set to about −80° C. to −60° C.

In other words, after all components are formed between the substrate 180 and the substrate 200, the substrate 180 and the color filter substrate 200 are always placed in an atmosphere with a dew point of −60° C., which contains little moisture, until the cell process ends. Note that when the treatment chamber is not set to reduced pressure, such as when the substrate is transferred, or the like, the atmosphere is set to an inert atmosphere such as a nitrogen atmosphere or an argon atmosphere.

<Drying Treatment>

The substrate 180 and the color filter substrate 200 are subjected to drying treatment. As the drying treatment, heat treatment is performed under reduced pressure. The heating temperature is set to higher than or equal to 100° C., preferably higher than or equal to 150° C. The reduced pressure is set to preferably lower than or equal to 1 Pa, more preferably lower than or equal to $10^{-4}$ Pa. For example, the pressure of the treatment chamber is set to $1\times10^{-5}$ Pa.

Note that in the heat treatment performed as the drying treatment, a practitioner can determine the upper limit of the heating temperature as appropriate considering the heat resistance of a material used for the substrate 180 and the pressure under the reduced pressure. For example, in the case where the substrate 180 is formed using an organic acrylic resin, it is preferable that the upper limit of the heating temperature be set to about 180° C. to 250° C. Further, for example, in the case where the substrate 180 is formed using an organic polyimide resin, it is preferable that the upper limit of the heating temperature be set to about 250° C. to 300° C.

<Transfer of Element Layer>

Next, a step of transferring the element layer 170 over the substrate 180 to the substrate 100 having flexibility is described using FIGS. 21A to 21C and FIG. 22. In this embodiment, the case where the element layer 170 is transferred by providing the separation layer 174 including the metal oxide film between the substrate 180 having heat resistance and the element layer 170, weakening the metal oxide film by crystallization, and separating the element layer 170 is described. Note that the element layer 170 can be transferred by a variety of methods other than the above method, such as a method in which an amorphous silicon film containing hydrogen is provided between the substrate 180 and the element layer 170 and removed by irradiation with laser light or etching to separate the element layer 170 or a method in which the element layer 170 is separated from the substrate 180 by mechanically removing the substrate 180.

Figure 21A:
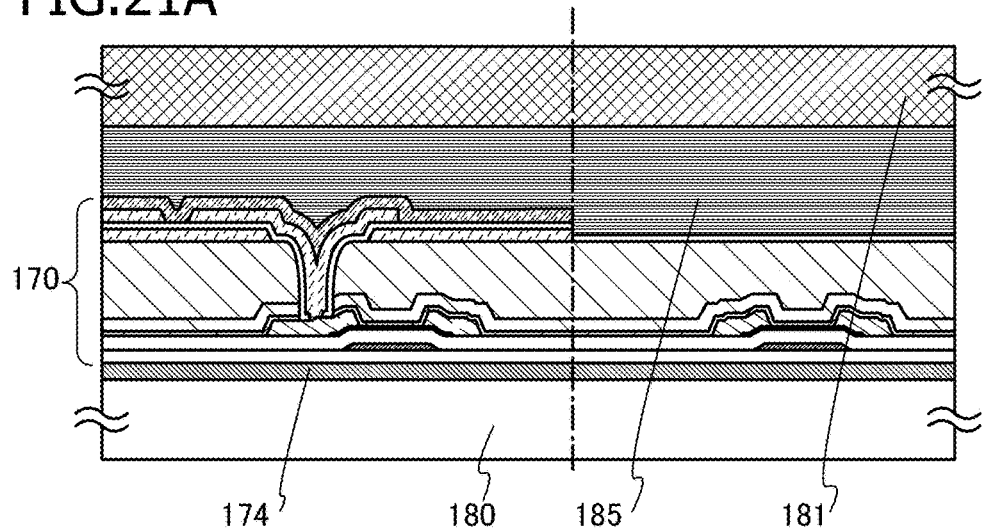
FIGS. 21A to 21C are cross-sectional views illustrating steps of manufacturing a liquid crystal display device.

First, as illustrated in FIG. 21A, a supporting substrate 181 is bonded to a surface of the element layer 170, which does not face the substrate 180, with an adhesive 185. As the supporting substrate 181, a glass substrate, a quartz substrate, a sapphire substrate, a ceramic substrate, a metal substrate, or the like can be used. As the adhesive 185, a material which can be separated from the element layer 170 in a later step is used. For example, as the adhesive 185, an adhesive which can be separated by irradiation with ultraviolet light or the like may be used.

Figure 21B:
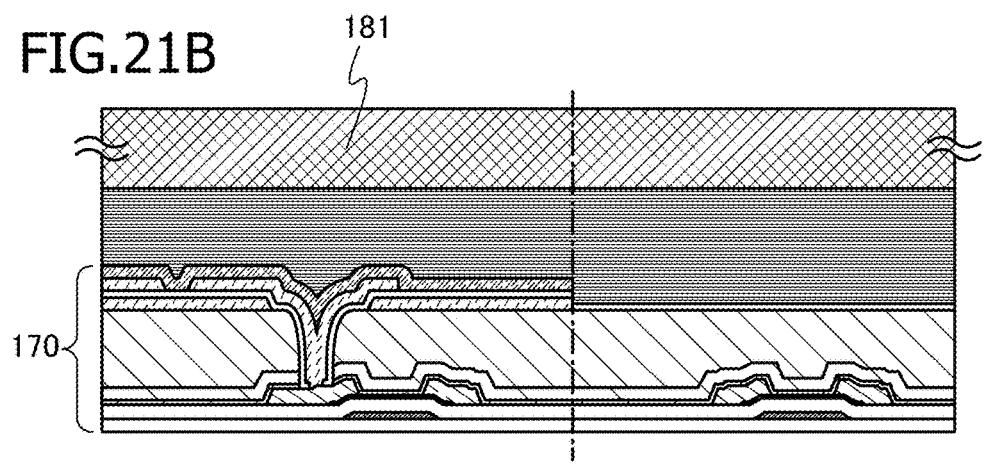

Next, as illustrated in FIG. 21B, the element layer 170 and the supporting substrate 181 are separated from the substrate 180. In this embodiment, the element layer 170 and the supporting substrate 181 are separated from the substrate 180 using physical force. The separation layer 174 may partially remain on the element layer 170 without being removed entirely. The separation can be performed by being pulled by a human hand or a gripping tool, or separating while rolling a roller.

Figure 21C:
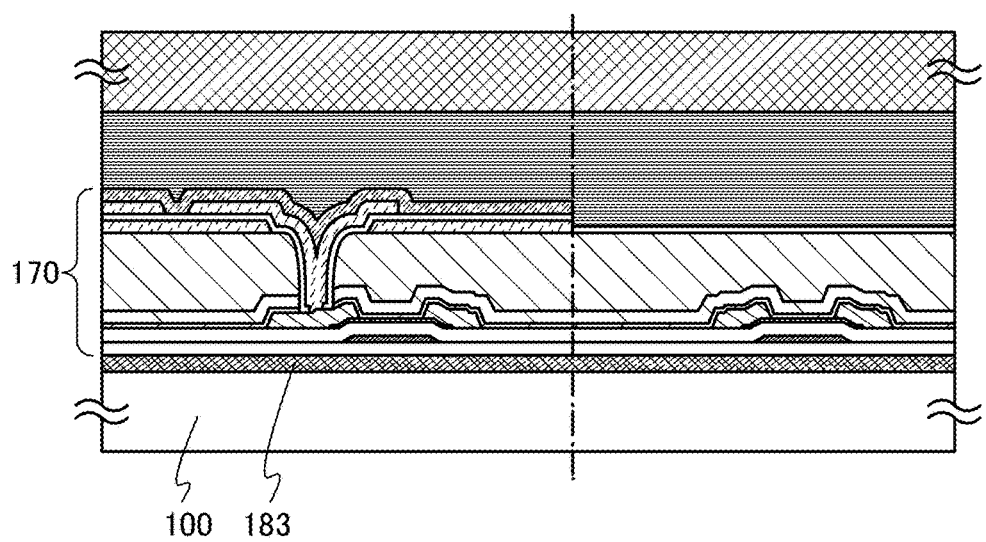

Next, as illustrated in FIG. 21C, the substrate 100 is bonded to a surface of the element layer 170, which is exposed by the separation, with an adhesive 183.

The substrate 100 has flexibility as described above and can be a substrate of a resin such as plastic.

As the adhesive 183, a material with which the substrate 100 and the element layer 170 can be bonded to each other is used. As the adhesive 183, for example, any of a variety of curable adhesives, e.g., a reactive curable adhesive, a thermosetting adhesive, a photo curable adhesive such as a UV curable adhesive, and an anaerobic adhesive can be used.

Figure 22:
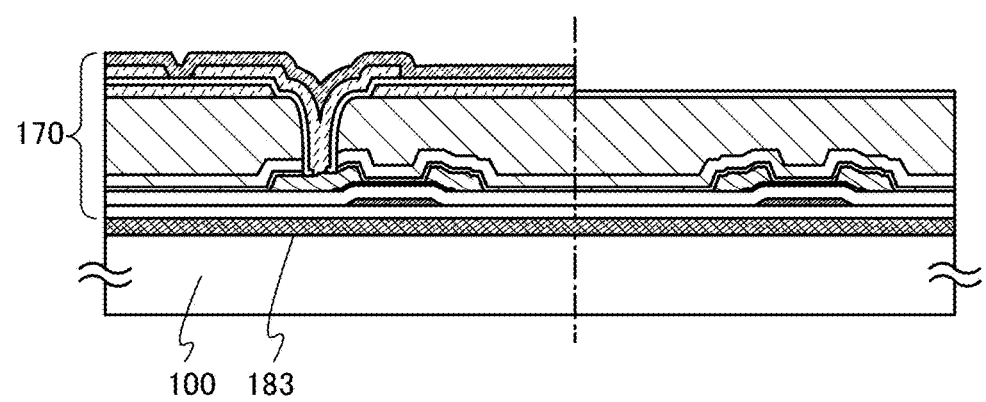
FIG. 22 is a cross-sectional view illustrating a step of manufacturing a liquid crystal display device.

Then, the supporting substrate 181 and the adhesive 185 are removed (FIG. 22).

<Application of Sealant and Dropping of Liquid Crystal>

Next, a sealant is applied over the color filter substrate 200 in order to seal the liquid crystal material. Here, an ultraviolet curable sealant for a one drop filling (ODF) method is applied. Next, the liquid crystal material is dropped in a region surrounded by the sealant on the color filter substrate 200. This step is performed in a nitrogen atmosphere.

<Bonding Step>

Next, the circuit board 100 and the color filter substrate 200 are transferred to a treatment chamber for bonding. The atmosphere of the treatment chamber is set to reduced pressure of higher than or equal to 0.1 Pa and lower than or equal to 20 kPa, preferably higher than or equal to 1 Pa and lower than or equal to 100 Pa, and the circuit board 100 and the color filter substrate 200 are bonded to each other. Then, the circuit board 100 and the color filter substrate 200 which are bonded to each other are transferred to another treatment chamber and the sealant is cured by irradiation with ultraviolet light, so that the sealing member 215 is finished. This step is performed in a nitrogen atmosphere.

Through the above cell process, a liquid crystal panel in which the liquid crystal layer 140 is sealed between the circuit board 100 and the color filter substrate 200 can be manufactured. By performing drying treatment (heat treatment) on the circuit board 100 and the color filter substrate 200 and controlling the atmosphere to keep a drying state of these substrates in the cell process, deterioration of the liquid crystal panel, which is caused by moisture, can be suppressed. Note that this will be described in Example 1.

By employing this embodiment, deterioration of a liquid crystal display device including an oxide semiconductor for a backplane (the circuit board 100), which is due to moisture, can be reduced. Accordingly, a highly reliable liquid crystal display device including an oxide semiconductor can be provided.

Further, by combination of a pixel structure of an FFS-mode and a transistor including a crystalline oxide semiconductor film, a liquid crystal display device with high reliability, high definition, and low power consumption can be provided.

Thus, an FFS-mode liquid crystal display device having a pixel aperture ratio of higher than or equal to 50% (preferably higher than or equal to 60%) and a resolution of higher than or equal to 300 dpi can be provided. FIG. 29 shows an example of specifications of a liquid crystal panel using an oxide semiconductor transistor.

This embodiment can be implemented in combination with any of the other embodiments as appropriate.

(Embodiment 2)

An oxide semiconductor film forming the semiconductor layer 120 is described in detail.

The oxide semiconductor film forming the semiconductor layer 120 is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, a change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By increasing the substrate temperature during the deposition, migration of flat-plate-like sputtered particles which have reached the substrate occurs, so that a flat plane of the flat-plate-like sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

Specifically, the substrate temperature during the deposition is preferably higher than or equal to 100° C. and lower than or equal to 740° C., more preferably higher than or equal to 200° C. and lower than or equal to 500° C.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. Further, the heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film for a shorter time.

The oxide semiconductor film 311 contains one or more kinds of elements contained in the oxide semiconductor film 312. The energy at the bottom of the conduction band of the oxide semiconductor film 311 is located closer to the vacuum level than that of the oxide semiconductor film 312 by 0.05 eV or more, 0.07 eV or more, 0.1 eV or more, or 0.15 eV or more and 2 eV or less, 1 eV or less, 0.5 eV or less, or 0.4 eV or less. Note that the oxide semiconductor film 312 preferably contains at least indium in order that the carrier mobility is high. When an electric field is applied to the gate electrode (the scan line 110) of the transistor at this time, a channel is formed in the oxide semiconductor film 312 of the semiconductor layer 120, whose energy at the bottom of the conduction band is low. That is, the oxide semiconductor film 311 is formed between the oxide semiconductor film 312 and the gate insulating film (the insulating film 131), whereby a channel of the transistor can be formed in the oxide semiconductor film 312 which is not in contact with the insulating film 131. Further, since the oxide semiconductor film 311 contains one or more kinds of elements contained in the oxide semiconductor film 312, interface scattering is unlikely to occur at the interface between the oxide semiconductor film 312 and the oxide semiconductor film 311. Thus, the transistor can have high field-effect mobility because the movement of carriers is not hindered at the interface.

The oxide semiconductor film 311 may be, for example, an oxide film containing aluminum, silicon, titanium, gallium, germanium, yttrium, zirconium, tin, lanthanum, cerium, or hafnium at a higher atomic ratio than the oxide semiconductor film 312. Specifically, as the oxide semiconductor film 311, an oxide film containing the above element in an atomic ratio 1.5 times or more, preferably twice or more, more preferably three times or more that in the oxide semiconductor film 312 is used. The above element is strongly bonded to oxygen and thus has a function of suppressing generation of an oxygen vacancy in the oxide film. That is, an oxygen vacancy is more unlikely to be generated in the oxide semiconductor film 311 than in the oxide semiconductor film 312.

Alternatively, when each of the oxide semiconductor film 311 and the oxide semiconductor film 312 is an In-M-Zn oxide and the oxide semiconductor film 311 and the oxide semiconductor film 312 contain In, M, and Zn in an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor film 311 and the oxide semiconductor film 312 in which $y_1/x_1$ is 1.5 times or more as large as $y_2/x_2$ are selected. More preferably, the oxide semiconductor film 311 and the oxide semiconductor film 312 in which $y_1/x_1$ is twice or more as large as $y_2/x_2$ are selected. Still more preferably, the oxide semiconductor film 311 and the oxide semiconductor film 312 in which $y_1/x_1$ is three times or more as large as $y_2/x_2$ are selected.

The thickness of the oxide semiconductor film 311 is greater than or equal to 3 nm and less than or equal to 100 nm, preferably greater than or equal to 3 nm and less than or equal to 50 nm. The thickness of the oxide semiconductor film 312 is greater than or equal to 3 nm and less than or equal to 200 nm, preferably greater than or equal to 3 nm and less than or equal to 100 nm, more preferably greater than or equal to 3 nm and less than or equal to 50 nm.

The oxide semiconductor film 313 is an oxide film which contains one or more kinds of elements contained in the oxide semiconductor film 312. The energy at the bottom of the conduction band of the oxide semiconductor film 313 is located closer to the vacuum level than that of the oxide semiconductor film 312 by 0.05 eV or more, 0.07 eV or more, 0.1 eV or more, or 0.15 eV or more and 2 eV or less, 1 eV or less, 0.5 eV or less, or 0.4 eV or less. Since the oxide semiconductor film 313 contains one or more kinds of elements contained in the oxide semiconductor film 312, an interface state is unlikely to be formed at the interface between the oxide semiconductor film 312 and the oxide semiconductor film 313. When the interface has an interface state, in some cases, a second transistor in which the interface serves as a channel and which has a different threshold voltage is formed; accordingly, the apparent threshold voltage of the transistor is changed. Thus, with the oxide semiconductor film 313, fluctuation in electric characteristics of the transistors, such as a threshold voltage, can be reduced.

The oxide semiconductor film 313 may be, for example, an oxide film containing aluminum, silicon, titanium, gallium, germanium, yttrium, zirconium, tin, lanthanum, cerium, or hafnium at a higher atomic ratio than the oxide semiconductor film 312. Specifically, as the oxide semiconductor film 313, an oxide film containing the above element in an atomic ratio 1.5 times or more, preferably twice or more, more preferably three times or more that in the oxide semiconductor film 312 is used. The above element is strongly bonded to oxygen and thus has a function of suppressing generation of an oxygen vacancy in the oxide film. That is, an oxygen vacancy is more unlikely to be generated in the oxide semiconductor film 313 than in the oxide semiconductor film 312.

Further alternatively, when each of the oxide semiconductor film 312 and the oxide semiconductor film 313 is an In-M-Zn oxide and the oxide semiconductor film 312 and the oxide semiconductor film 313 contain In, M, and Zn in an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor film 312 and the oxide semiconductor film 313 in which $y_3/x_3$ is 1.5 times or more as large as $y_2/x_2$ are selected. More preferably, the oxide semiconductor film 312 and the oxide semiconductor film 313 in which $y_3/x_3$ is twice or more as large as $y_2/x_2$ are selected. Still more preferably, the oxide semiconductor film 312 and the oxide semiconductor film 313 in which $y_3/x_3$ is three times or more as large as $y_2/x_2$ are selected. Here, in the oxide semiconductor film 312, $y_2$ is preferably larger than or equal to $x_2$ because the transistor can have stable electric characteristics. However, when $y_2$ is three times or more as large as $x_2$, the field-effect mobility of the transistor is reduced; accordingly, $y_2$ is preferably greater than or equal to $x_2$ and smaller than three times $x_2$.

The thickness of the oxide semiconductor film 313 is greater than or equal to 3 nm and less than or equal to 100 nm, preferably greater than or equal to 3 nm and less than or equal to 50 nm.

In the semiconductor layer 120 having a three-layer structure, the oxide semiconductor films 311 to 313 each are crystalline or a structure in which no clear crystal part can be seen in a TEM image. It is preferable that the oxide semiconductor film 311 be a structure in which no clear crystal part can be seen in a TEM image, the oxide semiconductor film 312 be crystalline, and the oxide semiconductor film 313 be crystalline or a structure in which no clear crystal part can be seen in a TEM image. When the oxide semiconductor film 312 in which a channel is formed is crystalline, the transistor can have stable electric characteristics.

Note that a channel formation region refers to a region of a semiconductor layer of a transistor, which overlaps with a gate electrode and which is between a source electrode and a drain electrode. Further, a channel refers to a region through which current mainly flows in the channel formation region.

Here, an In—Ga—Zn oxide film formed by a sputtering method is used as each of the oxide semiconductor films 311 to 313.

For deposition of the oxide semiconductor films 311 and 313, a sputtering target of an In—Ga—Zn oxide (In:Ga:Zn=1:3:2 [atomic ratio]) can be used. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Alternatively, the CAAC-OS film is used as the oxide semiconductor film 312. Thus, a sputtering target of an In—Ga—Zn oxide (In:Ga:Zn=1:1:1 [atomic ratio]) which is polycrystalline is preferably used for the deposition. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

This embodiment can be implemented in combination with any of the other embodiments as appropriate.

(Embodiment 3)

The liquid crystal panel 10 in FIG. 1 provided with a touch sensor (contact detector) can function as a touch panel.

In this embodiment, a touch panel is described with reference to FIG. 10, FIG. 11, and FIGS. 12A and 12B.

Figure 10:
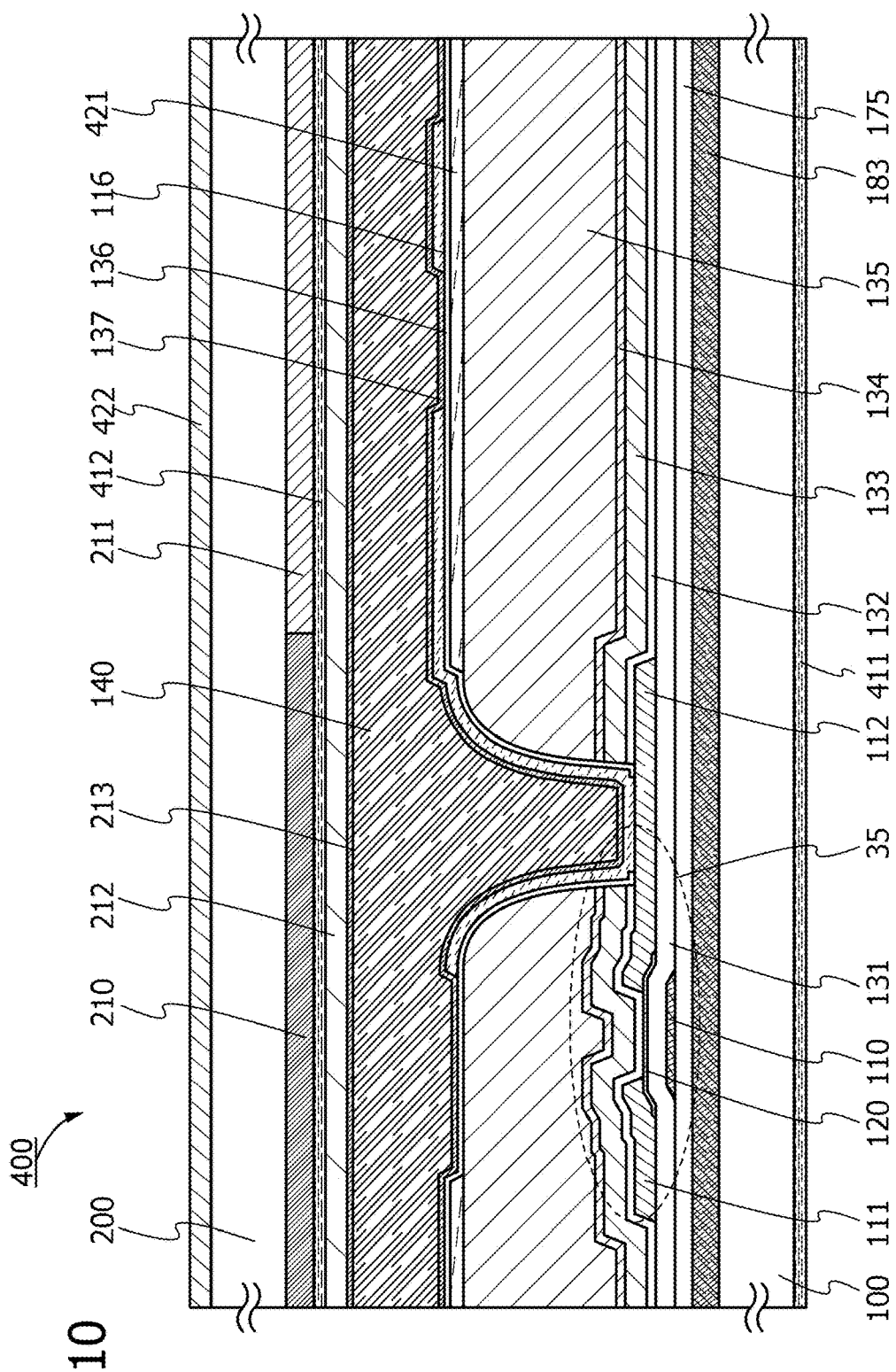
FIG. 10 is a cross-sectional view illustrating a structure example of a touch panel including the liquid crystal panel in FIG. 1.

FIG. 10 is a cross-sectional view illustrating a structure example of a touch panel 400 using the liquid crystal panel 10. The touch panel 400 includes a capacitive sensor as a touch sensor. A polarizing plate 411 is attached to the outer side of the substrate 100, and a polarizing plate 412 is attached to the inner side of the substrate 200. Note that the polarizing plate 412 may be provided on the outer side of the substrate 200.

A common electrode 421 over the substrate 100 serves as a common electrode of a pixel and an electrode of a capacitor in the touch sensor. An electrode 422 is provided on the outer side of the substrate 200. In the case where the polarizing plate 412 is provided on the outer side of the substrate 200, the electrode 422 may be provided between the substrate 200 and the polarizing plate 412. The electrode 422 serves as an electrode of a capacitor in the touch sensor. Further, since the liquid crystal panel 10 has a pixel structure of an FFS-mode, a conductive film is not formed on the substrate 200 side; thus, the electrode 422 functions as an antistatic conductor for the substrate 200.

Figure 11:
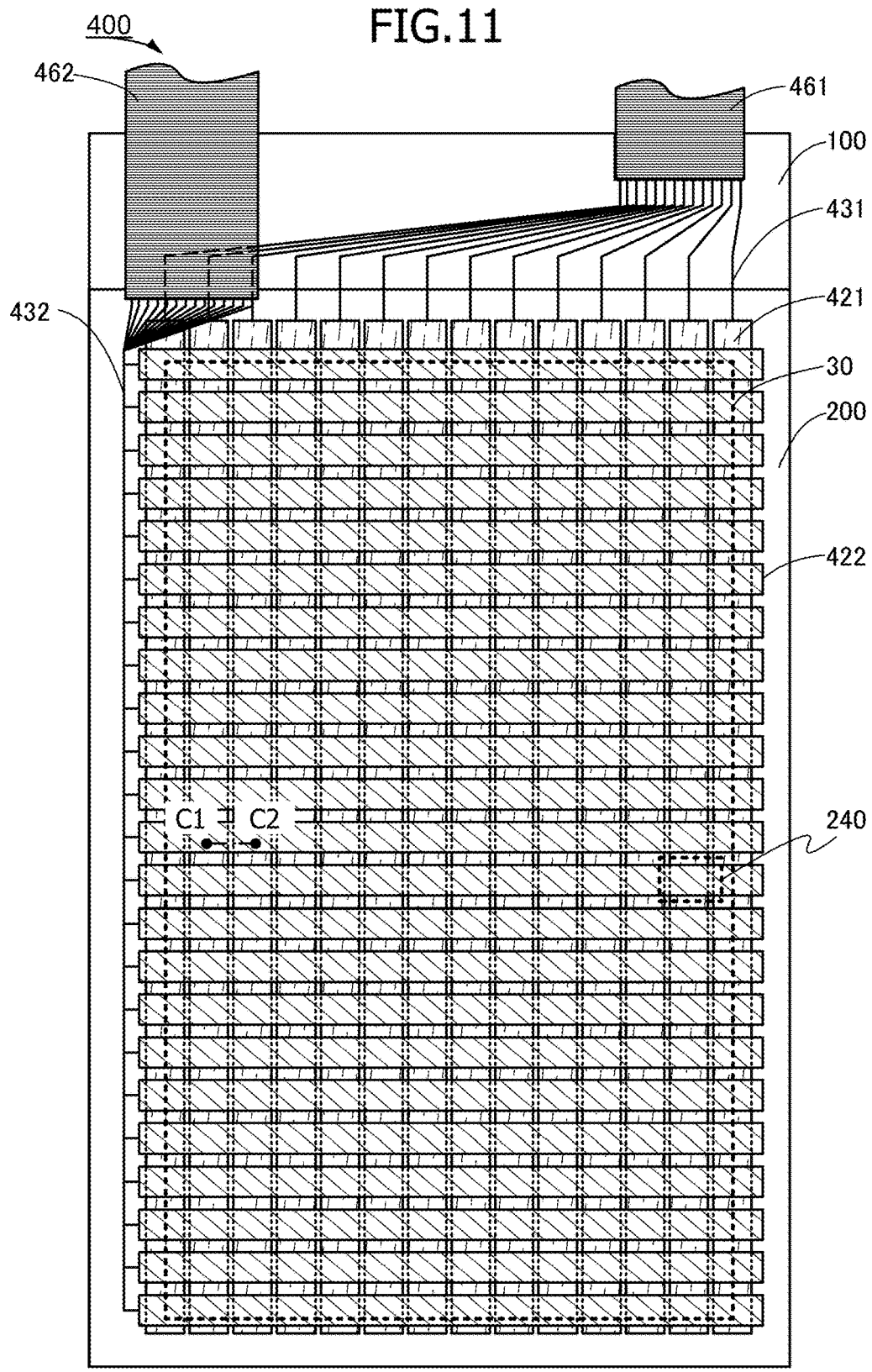
FIG. 11 is a plan view illustrating a structure example of a touch sensor of the touch panel in FIG. 10.
Figure 12A:
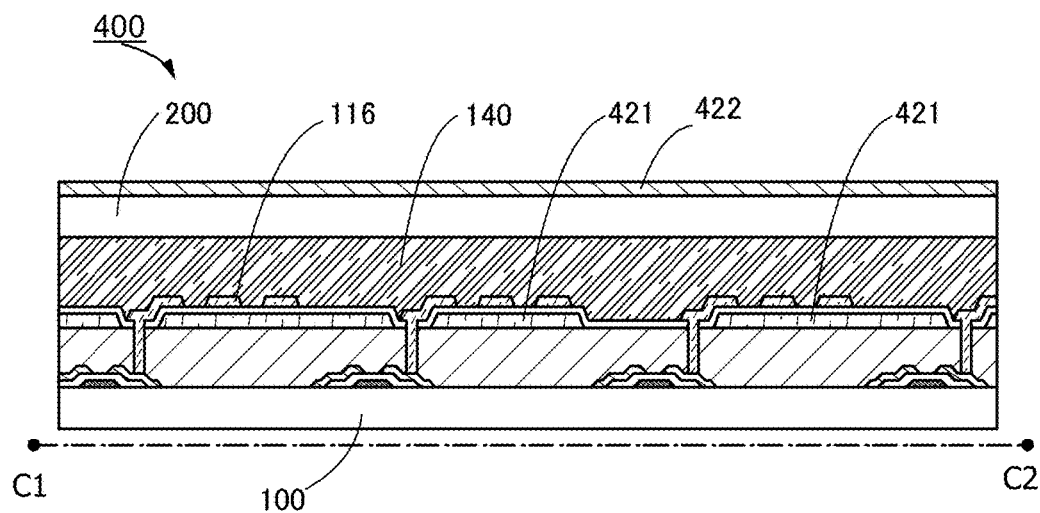
FIG. 12A is a cross-sectional view of the touch panel taken along line C1-C2 in FIG. 11
Figure 12B:
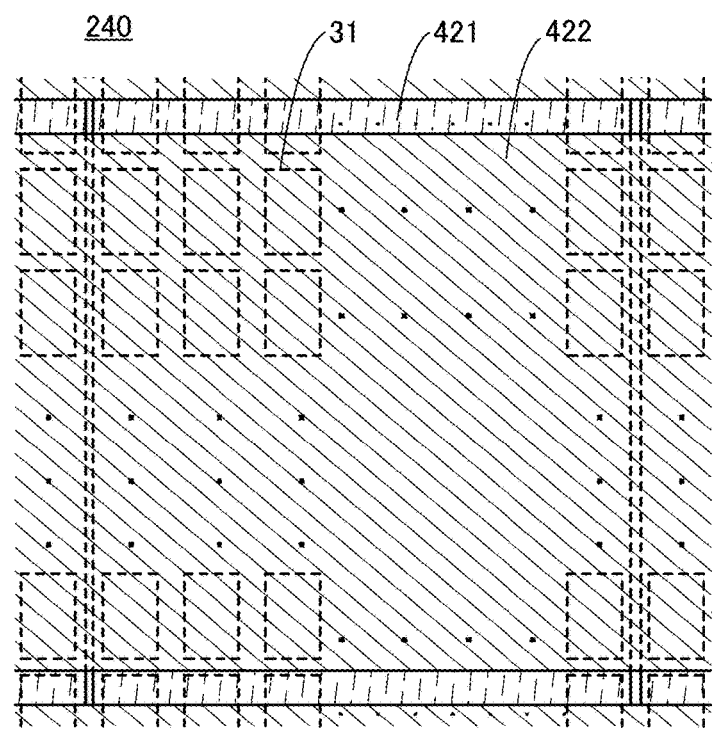
FIG. 12B is a plan view of a region 240 in FIG. 11.

The touch sensor of the touch panel 400 is described with reference to FIG. 11 and FIGS. 12A and 12B. FIG. 11 is a plan view illustrating a structure example of the common electrode 421 and the electrode 422 of the touch panel 400, FIG. 12A is a cross-sectional view taken along line C1-C2 in FIG. 11, and FIG. 12B is a plan view of a region 240 in FIG. 11.

The common electrode 421 and the electrode 422 each have a stripe shape and are provided so as to be perpendicular to each other on a plane. A plurality of pixels 31 are provided in the region 240 where the common electrode 421 and the electrode 422 intersect with each other. Although the pixel electrode 116 is provided between the common electrode 421 and the electrode 422, the common electrode 421 may be provided between the pixel electrode 116 and the electrode 422. Each common electrode 421 is connected to an FPC 461 through a lead wiring 431, and each electrode 422 is connected to an FPC 462 attached to the substrate 200 through a lead wiring 432.

Capacitance of the touch sensor is formed in the region where the common electrode 421 and the electrode 422 intersect with each other. In the capacitor including the common electrode 421 and the electrode 422 as a pair of electrodes, the common electrode 421 is an electrode for supplying a potential to the capacitor. The electrode 422 is an electrode for obtaining current flowing through the capacitor.

Operations of the touch panel 400 can be broadly classified into two operations: a display operation of inputting an image signal to the pixel 31 and a sensing operation of detecting contact. In the display operation, the potential of the common electrode 421 is fixed at a low level. During a sensing period, pulse signals are sequentially applied to the common electrodes 421 and thus, the potentials of the common electrodes are set at a high level. At this time, when a finger touches the touch panel 400, capacitance due to the finger is applied to the capacitor of the touch sensor; thus, current flowing through the capacitor is changed, so that the potential of the electrode 422 is changed. The electrodes 422 are sequentially scanned and a change in the potential of the electrode 422 is detected, so that a position which is touched by the finger is detected.

As described above, when the touch panel is formed using the liquid crystal panel 10, the common electrode of the pixel originally provided in the FFS-mode liquid crystal panel 10 can be used as one of electrodes forming capacitance of the touch panel 400; thus, a touch panel that is thin and lightweight and has high display quality can be provided.

Although in FIG. 10, FIG. 11, and FIGS. 12A and 12B, the so-called in-cell touch panel 400 in which the common electrode 421 of the liquid crystal panel 10 functions as an electrode of a touch sensor is described as an example, an on-cell touch panel in which an electrode of a touch sensor and the common electrode 421 are separately provided is also included in one embodiment of the present invention.

Figure 24:
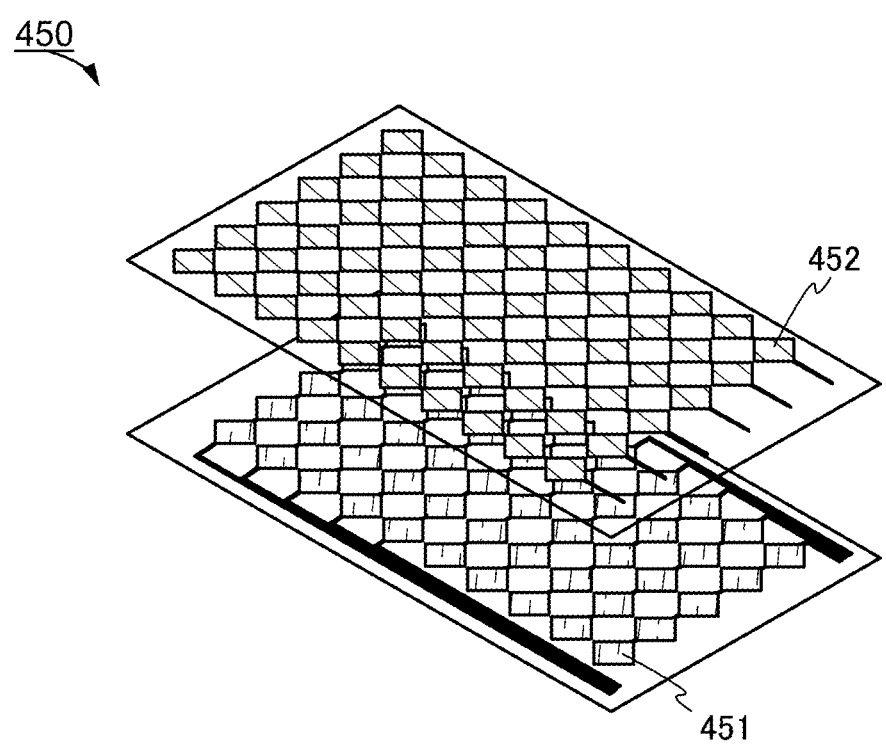
FIG. 24 is a perspective view of a touch sensor.
Figure 25:
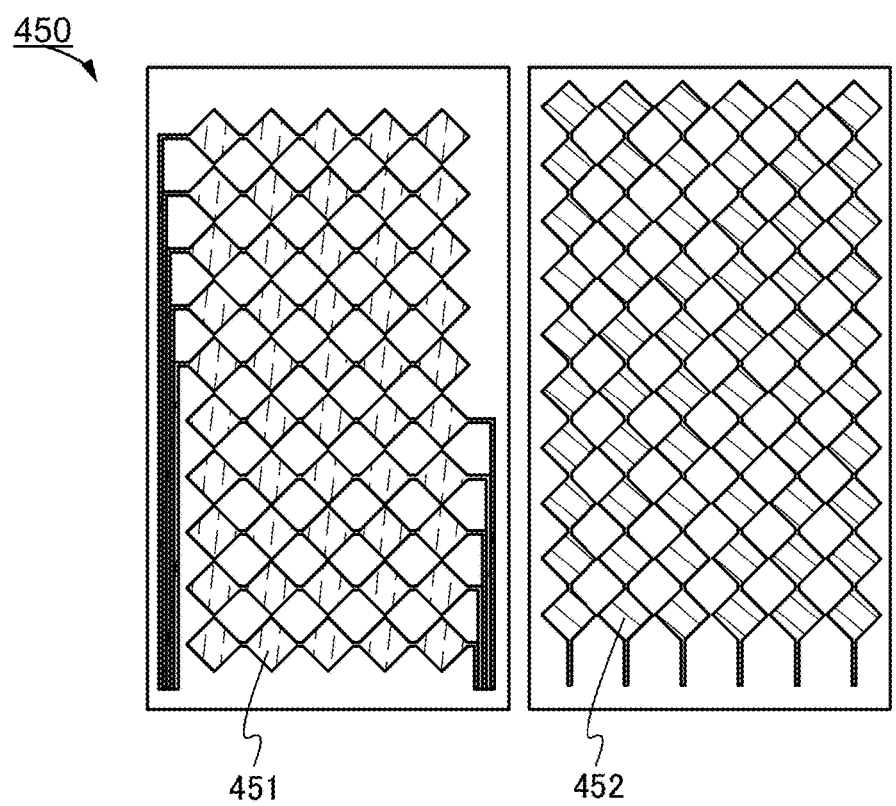
FIG. 25 is a plan view of a touch sensor.

FIG. 24 and FIG. 25 illustrate an example of a touch sensor which is included in an on-cell touch panel. FIG. 24 corresponds to a perspective view of a plurality of electrodes 451 and a plurality of electrodes 452, and FIG. 25 corresponds to a plan view of the plurality of electrodes 451 and the plurality of electrodes 452. The touch sensor illustrated in FIG. 24 and FIG. 25 includes the plurality of electrodes 451 arranged in an X-axis direction and the plurality of electrodes 452 arranged in a Y-axis direction which intersects with the X-axis direction.

The plurality of electrodes 451 and the plurality of electrodes 452 each have a shape in which a plurality of rectangular conductive films are connected to each other. In a touch sensor 450, the plurality of electrodes 451 and the plurality of electrodes 452 are provided so that the positions of the rectangular conductive films of the electrodes 451 are different from those of the rectangular conductive films of the electrodes 452. In the portion where the electrode 451 and the electrode 452 intersect with each other, an insulating film is provided between the electrode 451 and the electrode 452 so that the electrode 451 and the electrode 452 are not in contact with each other.

Figure 26:
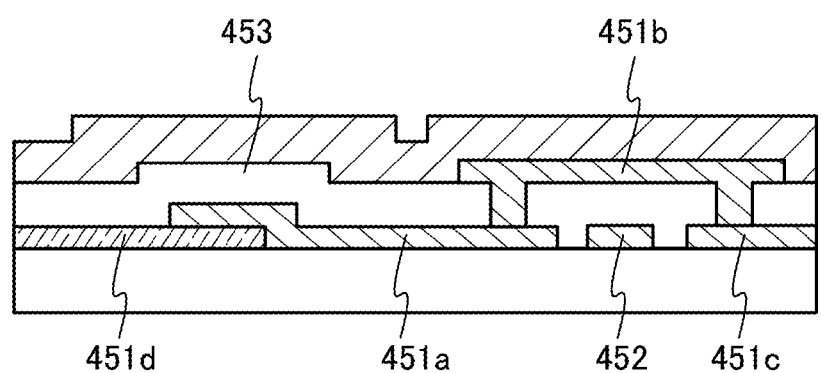
FIG. 26 is a cross-sectional view of a touch sensor.

FIG. 26 illustrates an example of a cross-sectional view of a portion where the electrode 451 and the electrode 452 intersect with each other of the touch sensor 450. In FIG. 26, the electrode 451 includes conductive films 451a to 451d. Further, the conductive film 451a, the conductive film 451c, the conductive film 451d, and the electrode 452 are formed on the same insulating surface, and an insulating film 453 is provided over the conductive film 451a, the conductive film 451c, the conductive film 451d, and the electrode 452. The conductive film 451b is provided over the insulating film 453 so as to straddle the electrode 452 and is connected to the conductive film 451a and the conductive film 451c in an opening portion provided in the insulating film 453.

With the above structure, the electrode 451 including the conductive films 451a to 451d can intersect with the electrode 452 without being in contact with the electrode 452.

The electrode 451 and the electrode 452 can be formed using conductive materials having a property of transmitting visible light, such as indium tin oxide including silicon oxide (ITSO), indium tin oxide (ITO), zinc oxide (ZnO), indium zinc oxide (IZO), and zinc oxide to which gallium is added (GZO), for example. Note that in the case where the conductive film 451d is a lead wiring, the conductive film 451d is not necessarily formed using a conductive material having a property of transmitting visible light.

Figure 27:
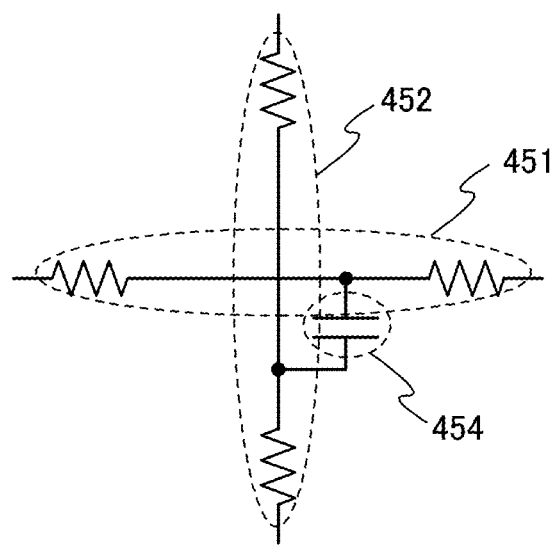
FIG. 27 is a circuit diagram of a touch sensor.

FIG. 27 is a circuit diagram of a portion where the electrode 451 and the electrode 452 intersect with each other. As illustrated in FIG. 27, a capacitor 454 is formed in the portion where the electrode 451 and the electrode 452 intersect with each other.

Figure 28:
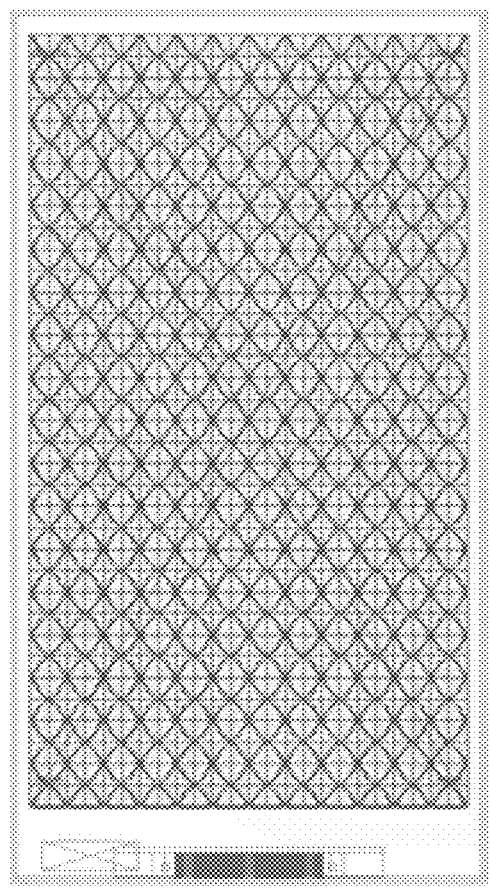
FIG. 28 is a mask pattern of a touch sensor.

FIG. 28 illustrates a mask pattern of an actually designed touch sensor.

By adding the touch sensor 450 having the above-described structure to a liquid crystal panel, a touch panel can be formed.

(Embodiment 4)

In this embodiment, a driving method for reducing power consumption of a liquid crystal display device is described. By the driving method in this embodiment, power consumption of a liquid crystal display device including an oxide semiconductor transistor in a pixel can be further reduced. Reduction in power consumption of the liquid crystal display device is described with reference to FIG. 13, FIG. 14, and FIG. 15.

Figure 13:
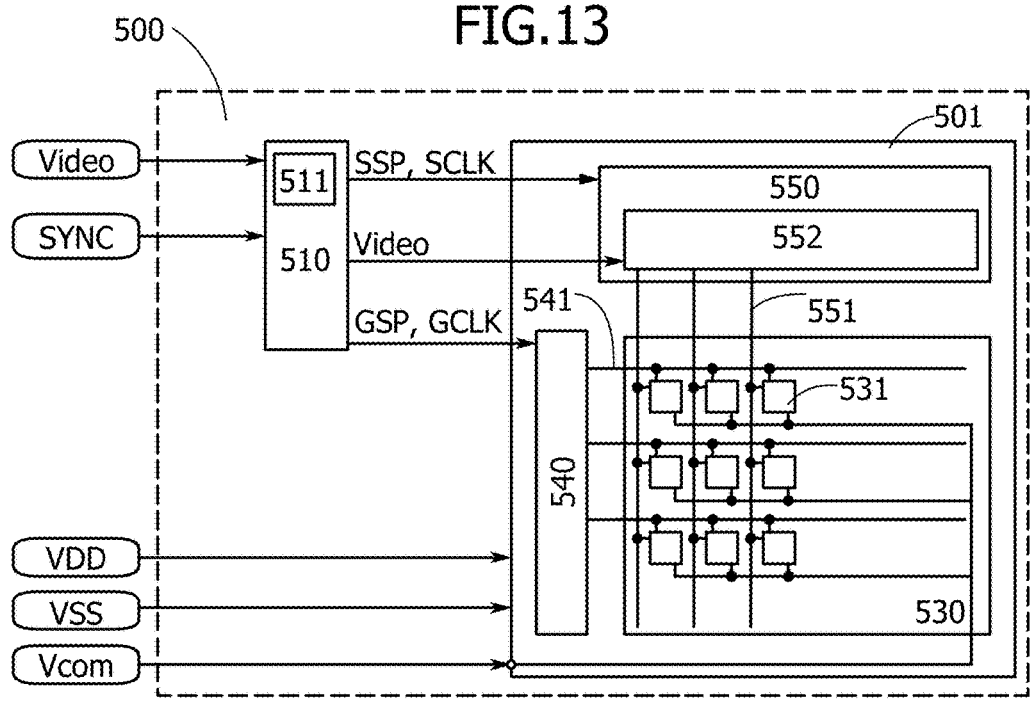
FIG. 13 is a block diagram illustrating a structure example of a liquid crystal display device including the liquid crystal panel in FIG. 1.

FIG. 13 is a block diagram illustrating a structure example of a liquid crystal display device in this embodiment. As illustrated in FIG. 13, a liquid crystal display device 500 includes a liquid crystal panel 501 and a control circuit 510. The liquid crystal panel 501 corresponds to the liquid crystal panel 10 in FIG. 1.

An image signal (Video), which is digital data, and a synchronization signal (SYNC) for controlling rewriting of a screen of the liquid crystal panel 501 are input to the liquid crystal display device 500. Examples of a synchronization signal include a horizontal synchronization signal (Hsync), a vertical synchronization signal (Vsync), and a reference clock signal (CLK).

The liquid crystal panel 501 includes a display portion 530, a scan line driver circuit 540, and a data line driver circuit 550. The display portion 530 includes a plurality of pixels 531. The pixels 531 in the same row are connected to the scan line driver circuit 540 through a common scan line 541, and the pixels 531 in the same column are connected to the data line driver circuit 550 through a common data line 551.

A high power supply voltage (VDD) and a low power supply voltage (VSS), which serve as power supply voltages, and a common voltage (Vcom) are supplied to the liquid crystal panel 501. The common voltage (hereinafter referred to as Vcom) is supplied to each pixel 531 in the display portion 530.

The data line driver circuit 550 processes an input image signal to generate a data signal, and outputs the data signal to the data line 551. The scan line driver circuit 540 outputs, to the scan line 541, a scan signal for selecting the pixel 531 into which a data signal is to be written.

The pixel 531 includes a switching element whose electrical connection to the data line 551 is controlled by a scan signal. When the switching element is turned on, a data signal is written into the pixel 531 through the data line 551.

The control circuit 510 controls the whole liquid crystal display device 500 and includes a circuit which generates control signals for circuits included in the liquid crystal display device 500.

The control circuit 510 includes a control signal generation circuit which generates control signals for the scan line driver circuit 540 and the data line driver circuit 550 on the basis of the synchronization signal (SYNC). Examples of a control signal for the scan line driver circuit 540 include a start pulse (GSP) and a clock signal (GCLK). Examples of a control signal for the data line driver circuit 550 include a start pulse (SSP) and a clock signal (SCLK). For example, the control circuit 510 generates a plurality of clock signals with the same cycle and shifted phases as the clock signals (GCLK and SCLK).

Further, the control circuit 510 controls output of an image signal (Video), which is input from the outside of the liquid crystal display device 500, to the data line driver circuit 550.

The data line driver circuit 550 includes a digital/analog conversion circuit 552 (hereinafter referred to as D-A conversion circuit 552). The D-A conversion circuit 552 converts an image signal to an analog signal, thereby generating a data signal.

Note that in the case where an image signal input to the liquid crystal display device 500 is an analog signal, the image signal is converted to a digital signal in the control circuit 510 and output to the liquid crystal panel 501.

An image signal is image data for each frame. The control circuit 510 has a function of performing image processing on the image signal and controlling output of the image signal to the data line driver circuit 550 on the basis of data obtained by the processing. For that function, the control circuit 510 includes a motion detection portion 511 which performs image processing on the image signal to detect motion in the image data for each frame. The control circuit 510 stops output of an image signal to the data line driver circuit 550 when the motion detection portion 511 determines that there is no motion, and restarts the output of an image signal when the motion detection portion 511 determines that there is motion.

There is no particular limitation on the image processing for detecting motion which is performed in the motion detection portion 511. An example of a method for detecting motion is to obtain difference data from image data for two consecutive frames. It can be determined whether there is motion or not from the obtained difference data. Another example of the method is to detect a motion vector.

In addition, the liquid crystal display device 500 may be provided with an image signal correction circuit which corrects an input image signal. For example, an image signal is corrected such that a voltage higher than a voltage corresponding to the gray level of the image signal is written into the pixel 531. Such correction can shorten the response time of the liquid crystal element 536. A method in which the control circuit 510 is driven with an image signal corrected in this manner is referred to as overdriving. In the case of performing high frame rate driving in which the liquid crystal display device 500 is driven at an integral multiple of the frame frequency of an image signal, image data for interpolation between two frames or image data for performing black display between two frames may be generated in the control circuit 510.

Figure 15:
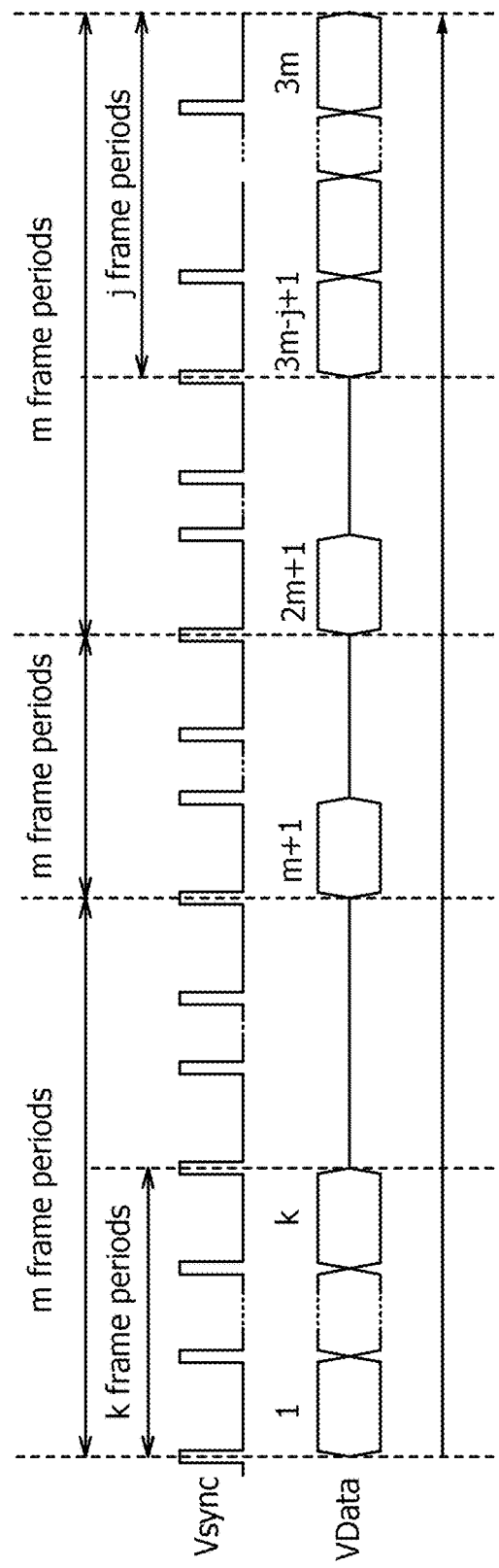
FIG. 15 is a timing chart illustrating an example of a method for driving the liquid crystal display device in FIG. 13.

The operation of the liquid crystal display device 500 for displaying an image with motion, such as a moving image, and an image without motion, such as a still image, is described below using a timing chart in FIG. 15. FIG. 15 shows the signal waveforms of a vertical synchronization signal (Vsync) and a data signal (Vdata) output to the data line 551 from the data line driver circuit 550.

FIG. 15 is a timing chart of the liquid crystal display device 500 during 3 m frame periods. Here, there is motion in image data in the first k frame periods and the last j frame periods and there is no motion in image data in the other frame periods. Note that k and j are each an integer greater than or equal to 1 and less than or equal to m−2.

In the first k frame periods, the motion detection portion 511 determines that there is motion in image data for each frame. The control circuit 510 outputs data signals (Vdata) to the data line 551 on the basis of the result of determination by the motion detection portion 511.

The motion detection portion 511 performs image processing for detecting motion and determines that there is no motion in image data for the (k+1)-th frame. Then, the control circuit 510 stops output of image signals (Video) to the data line driver circuit 550 in the (k+1)-th frame period on the basis of the result of determination by the motion detection portion 511. Thus, output of data signals (Vdata) from the data line driver circuit 550 to the data line 551 is stopped. Further, the control circuit 510 stops output of control signals (e.g., a start pulse signal and a clock signal) to the scan line driver circuit 540 and the data line driver circuit 550 in order to stop rewriting of the display portion 530. The control circuit 510 does not output an image signal to the data line driver circuit 550 nor output control signals to the scan line driver circuit 540 and the data line driver circuit 550, thereby keeping rewriting of the display portion 530 stopped, until the motion detection portion 511 determines that there is motion in image data.

Note that, in this specification, "to stop output of a signal" or "not to output a signal" means to apply voltage which is different from a predetermined voltage for operating a circuit to a wiring for supplying the signal, or to bring the wiring into an electrically floating state.

When rewriting of the display portion 530 is stopped, an electric field in one direction is kept applied to the liquid crystal element 536, which might lead to deterioration of liquid crystal in the liquid crystal element 536. In order to avoid such a problem, it is preferable that signals be supplied to the scan line driver circuit 540 and the data line driver circuit 550 from the control circuit 510 and data signals with an inverted polarity be written into the data line 551 at predetermined timings to invert the direction of the electric field applied to the liquid crystal element 536, regardless of the result of determination by the motion detection portion 511.

Note that the polarity of a data signal input to the data line 551 is determined based on Vcom. The polarity is positive when the voltage of the data signal is higher than Vcom, and is negative when the voltage of the data signal is lower than Vcom.

Specifically, as shown in FIG. 15, in the (m+1)-th frame period, the control circuit 510 outputs control signals to the scan line driver circuit 540 and the data line driver circuit 550 and outputs an image signal (Video) to the data line driver circuit 550. The data line driver circuit 550 outputs a data signal (Vdata) with a polarity opposite to that of a data signal (Vdata) output to the data line 551 in the k-th frame period to the data line 551. In this manner, a data signal (Vdata) with an inverted polarity is written into the data line 551 in the (m+1)-th frame period and in the (2m+1)-th frame period, which are periods in which no motion is detected in image data. Rewriting of the display portion 530 is intermittently performed in periods in which there is no change in image data; thus, it is possible to reduce power consumption due to rewriting and prevent deterioration of the liquid crystal element 536.

When the motion detection portion 511 determines that there is motion in image data for any frame after the (2m+1)-th frame, the control circuit 510 controls the scan line driver circuit 540 and the data line driver circuit 550 to perform rewriting of the display portion 530.

As described above, with the driving method in FIG. 15, the polarity of a data signal (Vdata) is inverted every m frame periods regardless of whether there is motion in image data (Video) or not. Meanwhile, the display portion 530 is rewritten every frame in periods in which an image with motion is displayed and is rewritten every m frames in periods in which an image without motion is displayed. Consequently, power consumed owing to rewriting of the display portion can be reduced. This can prevent an increase in power consumption due to an increase in driving frequency and the number of pixels.

As described above, in the liquid crystal display device 500, the method for driving the liquid crystal display device is switched depending on a moving image display mode or a still image display mode; thus, it is possible to provide a liquid crystal display device with low power consumption while preventing deterioration of liquid crystal and maintaining display quality.

Note that, in order to prevent deterioration of the liquid crystal, the interval between polarity inversions of data signals (here, m frame periods) is set to two seconds or shorter, preferably one second or shorter.

Although the detection of motion in image data is performed in the motion detection portion 511 in the control circuit 510, the detection of motion is not necessarily performed only in the motion detection portion 511. Data on whether there is motion or not may be input to the control circuit 510 from the outside of the liquid crystal display device 500.

Determination that there is no motion in image data is not always based on image data for two consecutive frames; the number of frames required for the determination may be set as appropriate depending on the usage mode of the liquid crystal display device 500. For example, rewriting of the display portion 530 may be stopped when there is no motion in image data for m consecutive frames.

In the case where a still image is displayed by rewriting the same image plural times, visible switching of the images may cause fatigue of the human eye. In the liquid crystal display device in this embodiment, the frequency of rewriting image data is reduced, which is effective in reducing eyestrain.

(Embodiment 5)

A liquid crystal display device of one embodiment of the present invention can consume less power. Thus, in the case of a portable electronic device that does not always receive power easily, such as a portable information terminal or a portable game machine, the use of the liquid crystal display device of one embodiment of the present invention is preferable because long continuous operating time can be secured.

The liquid crystal display device of one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the liquid crystal display device of one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 16A to 16E illustrate specific examples of these electronic devices.

Figure 16A:
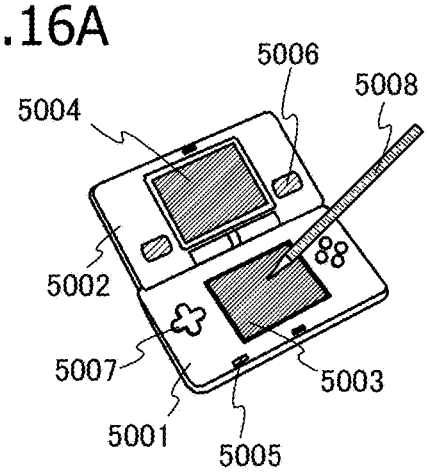
FIGS. 16A to 16E each illustrate an electronic device.

FIG. 16A illustrates a portable game machine, which includes a housing 5001, a housing 5002, a display portion 5003, a display portion 5004, a microphone 5005, speakers 5006, an operation key 5007, a stylus 5008, and the like. It is possible to use the liquid crystal display device of one embodiment of the present invention as the display portion 5003 or 5004. Note that although the portable game machine in FIG. 16A has the two display portions 5003 and 5004, the number of display portions included in the portable game machine is not limited thereto.

Figure 16B:
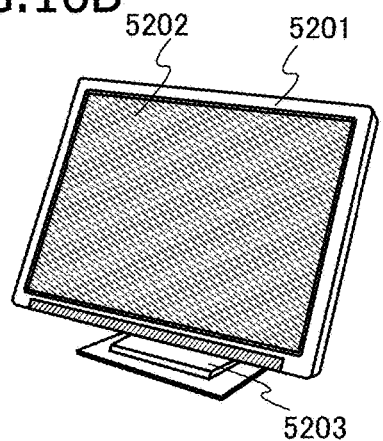

FIG. 16B illustrates a display device, which includes a housing 5201, a display portion 5202, a support 5203, and the like. It is possible to use the liquid crystal display device of one embodiment of the present invention as the display portion 5202. Note that the display device means all display devices for displaying information, such as display devices for personal computers, for receiving TV broadcast, and for displaying advertisements.

Figure 16C:
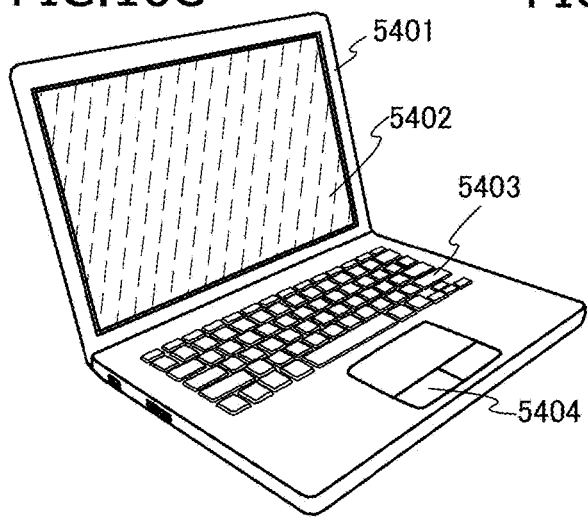

FIG. 16C illustrates a laptop, which includes a housing 5401, a display portion 5402, a keyboard 5403, a pointing device 5404, and the like. It is possible to use the liquid crystal display device of one embodiment of the present invention as the display portion 5402.

Figure 16D:
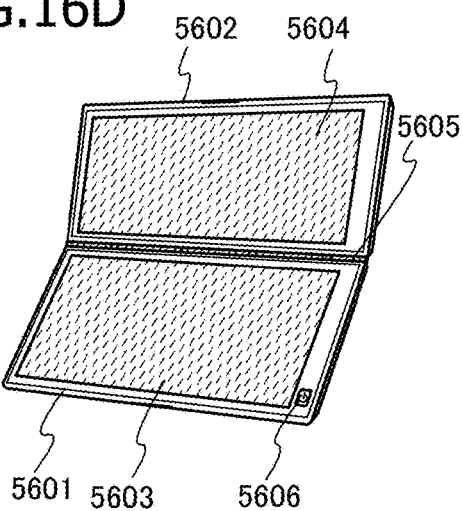

FIG. 16D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A liquid crystal display device with a position input function may be used as at least one of the first display portion 5603 and the second display portion 5604. Note that the position input function can be added by provision of a touch panel in a liquid crystal display device. Alternatively, the position input function can be added by provision of a photoelectric conversion element called a photosensor in a pixel portion of a liquid crystal display device. It is possible to use the liquid crystal display device of one embodiment of the present invention as the first display portion 5603 or the second display portion 5604.

Figure 16E:
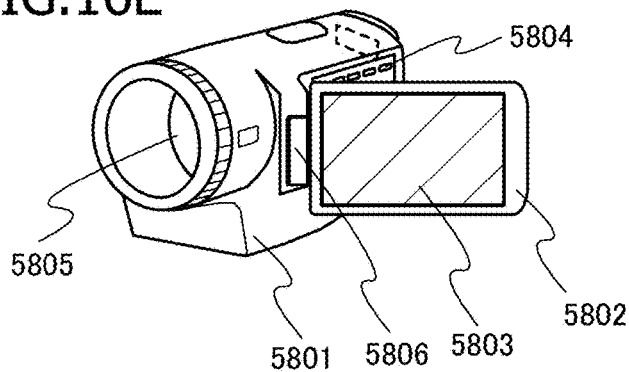

FIG. 16E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806. It is possible to use the liquid crystal display device of one embodiment of the present invention as the display portion 5803.

Figure 30:
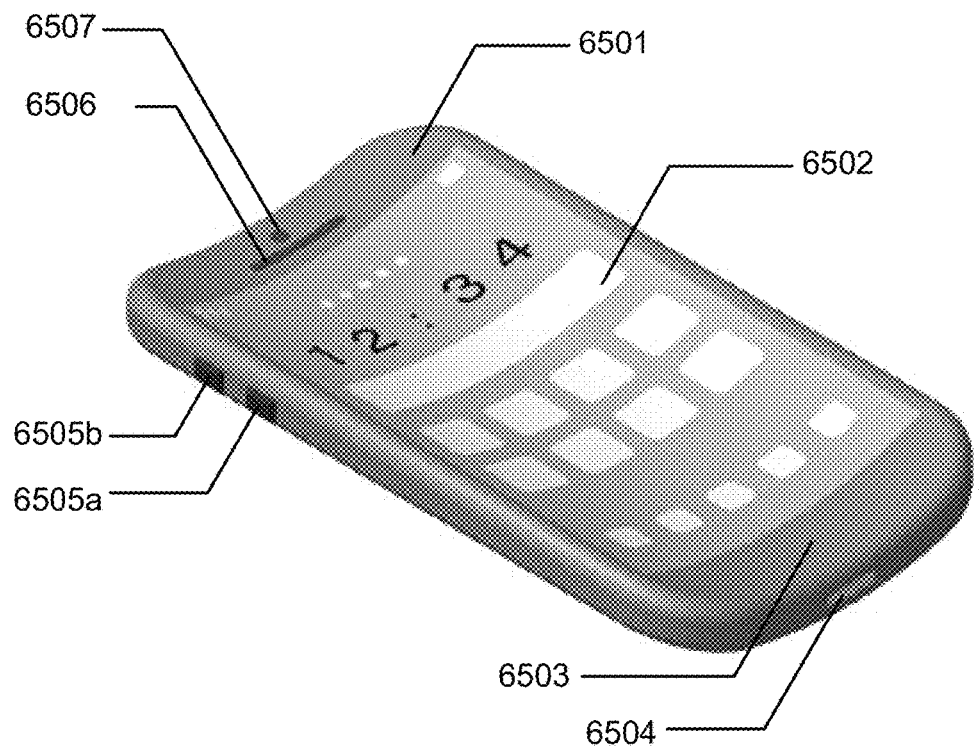
FIG. 30 illustrates an electronic device.

FIG. 30 illustrates a cellular phone, and a display portion 6502, a microphone 6503, a speaker 6506, a camera 6507, an external connection portion 6504, an operation button 6505a, and an operation button 6505b are provided in a housing 6501. It is possible to use the liquid crystal display device or the touch panel of one embodiment of the present invention as the display portion 6502. Since the liquid crystal display device or the touch panel of one embodiment of the present invention is provided over a flexible substrate, it can be applied to the display portion 6502 having a curved surface as illustrated in FIG. 30.

Figure 31:
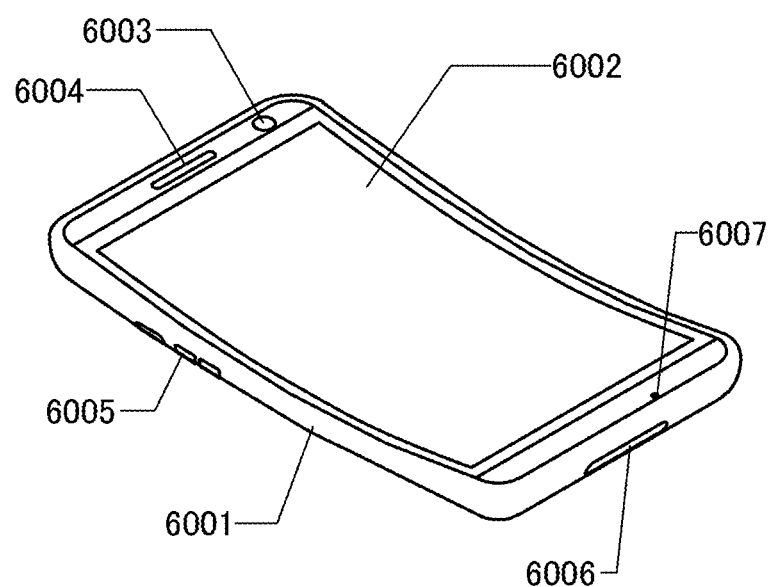
FIG. 31 illustrates an electronic device.

FIG. 31 illustrates a cellular phone, and a display portion 6002, a microphone 6007, a speaker 6004, a camera 6003, an external connection portion 6006, and an operation button 6005 are provided in a housing 6001. It is possible to use the liquid crystal display device or the touch panel of one embodiment of the present invention as the display portion 6002. Since the liquid crystal display device or the touch panel of one embodiment of the present invention is provided over a flexible substrate, it can be applied to the display portion 6002 having a curved surface, which is illustrated in FIG. 31.

This embodiment can be implemented in combination with any of the other embodiments as appropriate.

EXAMPLE 1

Effects of the drying treatment and the atmosphere control in the cell process as described in Embodiment 1 are described. In order to confirm the effects, results of examining the amount of moisture released from a circuit board used for a liquid crystal panel by thermal desorption spectroscopy (TDS) are described below.

First, seven circuit boards A to G which were used for the TDS are described.

The circuit boards A to D were totally formed in the same process up to and including formation of the alignment film. Further, in each of the circuit boards A to D, a 3-μm-thick organic resin film including an acrylic resin is formed between a transistor and a pixel electrode. The circuit board A was not subjected to heat treatment after formation of the alignment film. The circuit board B was subjected to heat treatment at 160° C. for one hour in a vacuum atmosphere of about $10^{-4}$ Pa after formation of the alignment film. The circuit board C was subjected to heat treatment at 150° C. for six hours in an air atmosphere after formation of the alignment film. The circuit board D was subjected to heat treatment at 160° C. for one hour in a vacuum atmosphere of about $10^{-4}$ Pa and then was exposed to an air atmosphere for ten minutes.

The circuit boards E to G were totally formed in the same process up to and including formation of the alignment film. The circuit boards E to G each have a structure in which an organic resin film including an acrylic resin is not provided between a transistor and a pixel electrode and a pixel electrode is provided over an inorganic insulating film that covers the transistor. The circuit board E was not subjected to heat treatment after formation of the alignment film. The circuit board F was subjected to heat treatment at 160° C. for one hour in a vacuum atmosphere of about $10^4$ Pa after formation of the alignment film. The circuit board G was subjected to heat treatment at 150° C. for six hours in an air atmosphere after formation of the alignment film.

In the TDS, the temperature of each board was raised from 60° C. to 230° C. at a speed of 20° C. per minute and the number of released gas molecules having a mass-to-charge ratio (m/z) of 18 was measured. Note that it is expected that the gas molecules having a mass-to-charge ratio (m/z) of 18 mainly include water. Further, an atmospheric pressure at the beginning of the measurement in a measurement chamber in which the circuit board was placed was $1.2 \times 10^{-7}$ Pa.

Figure 17:
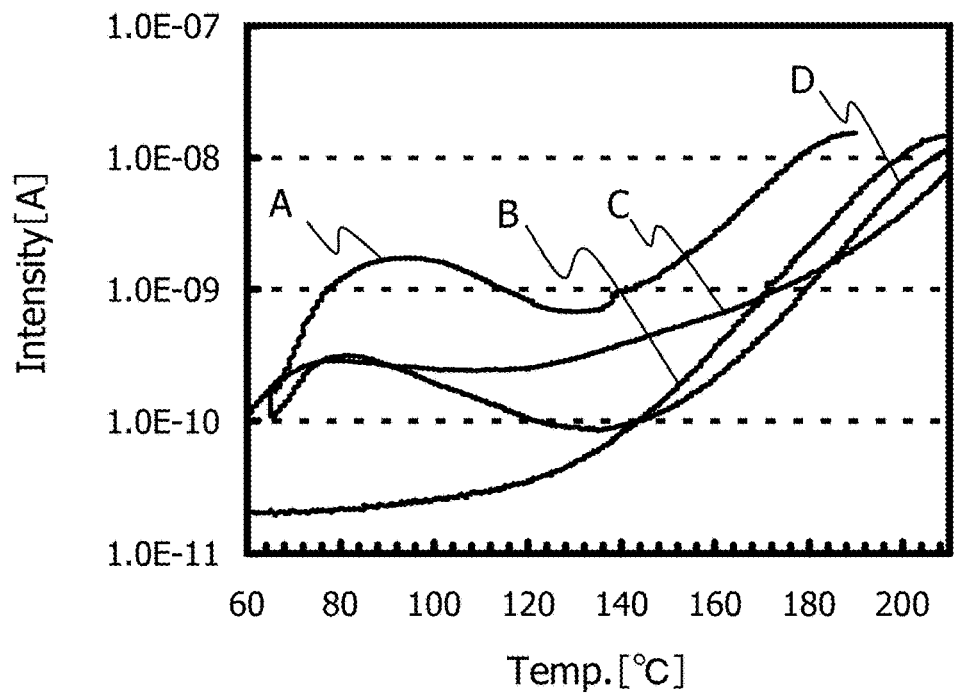
FIG. 17 is a graph showing the intensities of gas molecules having a mass-to-charge ratio (m/z) of 18 and being released from circuit boards (each including an organic resin film) of a liquid crystal panel, which are obtained by TDS.

FIG. 17 shows the intensities of gas molecules having a mass-to-charge ratio (m/z) of 18 and being released from each of the circuit boards A to D, which were obtained by TDS.

The circuit board A which was not subjected to heat treatment has a peak showing release of water at a substrate temperature around 90° C. On the other hand, unlike the circuit board A, the circuit board B which was subjected to heat treatment in a vacuum atmosphere does not have a peak showing release of water at a substrate temperature around 90° C.

When the circuit board B which was subjected to heat treatment in a vacuum atmosphere is compared with the circuit board C which was subjected to heat treatment in an air atmosphere, the circuit board B has higher intensity showing release of water than the circuit board C at substrate temperatures of 160° C. or less. Thus, it is expected that the amount of water included in each film included in the circuit board B which was subjected to heat treatment in a vacuum atmosphere is smaller than that in the circuit board C which was subjected to heat treatment in an air atmosphere.

Further, the circuit board D which was exposed to an air atmosphere after heat treatment in a vacuum atmosphere has a peak showing release of water at a substrate temperature around 80° C. When the circuit board B which was subjected to heat treatment in a vacuum atmosphere is compared with the circuit board D which was exposed to an air atmosphere after the heat treatment in a vacuum atmosphere, it is expected that the amount of water included in each film included in the circuit board D is larger than that in the circuit board B.

Figure 18:
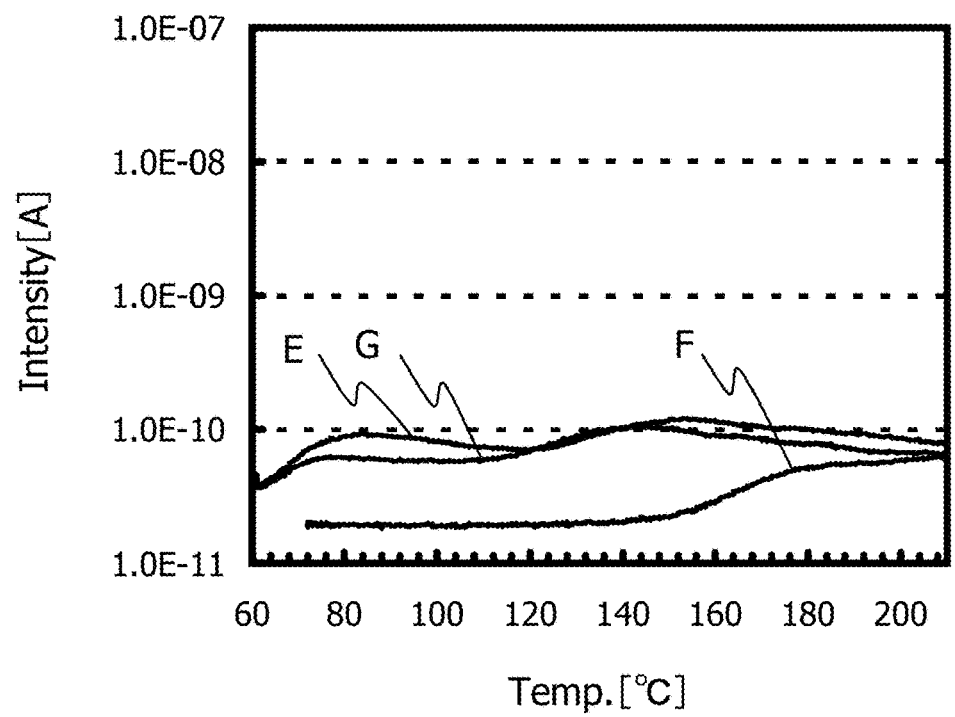
FIG. 18 is a graph showing the intensities of gas molecules having a mass-to-charge ratio (m/z) of 18 and being released from circuit boards (not including an organic resin film) of a liquid crystal panel, which are obtained by TDS.

Further, FIG. 18 shows the intensities of gas molecules having a mass-to-charge ratio (m/z) of 18 and being released from each of the circuit boards E to G, which were obtained by TDS.

When the intensity of the circuit board A including the organic resin film, which is shown in FIG. 17, is compared with that of the circuit board E not including the organic resin film, which is shown in FIG. 18, it is found that the intensity of the circuit board A is higher than that of the circuit board E in all the temperature ranges. Thus, as for the circuit boards A and E each of which was not subjected to heat treatment after formation of the alignment film, it can be considered that more water is released from the circuit board A including the organic resin film and that difference in the amount of released water is caused by water included in the organic resin film.

When the intensity of the circuit board C including the organic resin film, which is shown in FIG. 17, is compared with that of the circuit board G not including the organic resin film, which is shown in FIG. 18, it is found that the intensity of the circuit board C is higher than that of the circuit board F in all the temperature ranges.

Thus, as for the circuit boards C and G each of which was subjected to heat treatment in an air atmosphere after formation of the alignment film, it can be considered that more water is released from the circuit board C including the organic resin film and that the difference in the amount of released water is caused by water included in the organic resin film.

Further, when the intensity of the circuit board B including the organic resin film, which is shown in FIG. 17, is compared with that of the circuit board F not including the organic resin film, which is shown in FIG. 18, there are no significant difference in the intensities at temperatures of 100° C. or less, and the intensity of the circuit board B becomes higher when the temperature exceeds 100° C. Thus, as for the circuit boards B and F each of which was subjected to heat treatment in a vacuum atmosphere after formation of the alignment film, it can be considered that more water is released from the circuit board B including the organic resin film and that the difference in the amount of released water is caused by water included in the organic resin film. However, as for the circuit boards B and F each of which was subjected to heat treatment in a vacuum atmosphere, the difference in the amount of released water is smaller than that in the case of the circuit boards A and E and that in the case of the circuit boards C and G. Accordingly, it is considered that water included in the organic resin film is effectively released by heat treatment in a vacuum atmosphere compared with the case where heat treatment is not performed or the case where heat treatment is performed in an air atmosphere.

The above-described results of the TDS show that the liquid crystal panel of one embodiment of the present invention, in which a liquid crystal layer is sealed between substrates without being exposed to the air (e.g., in a nitrogen atmosphere) after heat treatment at 160° C. in a vacuum atmosphere, contains little water in the organic resin film.

Next, a change in operating margin width of a scan line driver circuit included in the liquid crystal panel over time is described. Liquid crystal panels H and I, whose changes in operating margin width over time were measured, are liquid crystal panels which were totally manufactured in the same process up to and including the step of forming an alignment film in a manner similar to the circuit boards A to D which were used for the TDS. In each of the liquid crystal panels H and I, a scan line driver circuit is formed over the same substrate as a pixel, and a 3 μm-thick organic resin film containing an acrylic resin is formed over a transistor included in the scan line driver circuit.

The liquid crystal panel H was manufactured in the following manner. After formation of the alignment film on each of substrates, heat treatment was performed at 160° C. for one hour in a vacuum atmosphere of about $10^{-4}$ Pa. After that, a sealant was drawn on one of the substrates in a nitrogen atmosphere, a liquid crystal material was dropped in a region surrounded by the sealant, and the substrates were bonded to each other in a vacuum atmosphere. Thus, the liquid crystal panel H in which a liquid crystal layer was sealed between the substrates was manufactured.

On the other hand, the liquid crystal panel I was manufactured in the following manner. After formation of the alignment film on each of substrates, heat treatment was performed at 150° C. for six hours in an air atmosphere. After that, a sealant was drawn on one of the substrates in an air atmosphere, a liquid crystal material was dropped in a region surrounded by the sealant, and the substrates were bonded to each other in a vacuum atmosphere. Thus, the liquid crystal panel I in which a liquid crystal layer was sealed between the substrates was manufactured.

An operating margin width (V) of the scan line driver circuit included in each of the liquid crystal panels H and I was examined in such a manner that a start pulse signal and a clock signal were input to sequential circuits of 959 stages included in a shift register of the scan line driver circuit, and a waveform of a signal thereby output from the sequential circuit of the last stage was observed using an oscilloscope.

As the start pulse signal, a signal having a pulse with a 68.3 μsec width which successively appears, with a frequency of 60 Hz, was used. Further, in each of the clock signal and the start pulse signal, a low voltage GVSS was −14V. The value of a high voltage GVDD where the waveform of a signal output from the sequential circuit of the last stage was disordered when the high voltage GVDD of each of the clock signal and the start pulse signal was gradually decreased from +14 V is defined as a voltage at which malfunction occurs (a malfunction voltage). Further, the difference between +14 V that is the highest voltage GVDD and the malfunction voltage is defined as an operating margin width.

Figure 19:
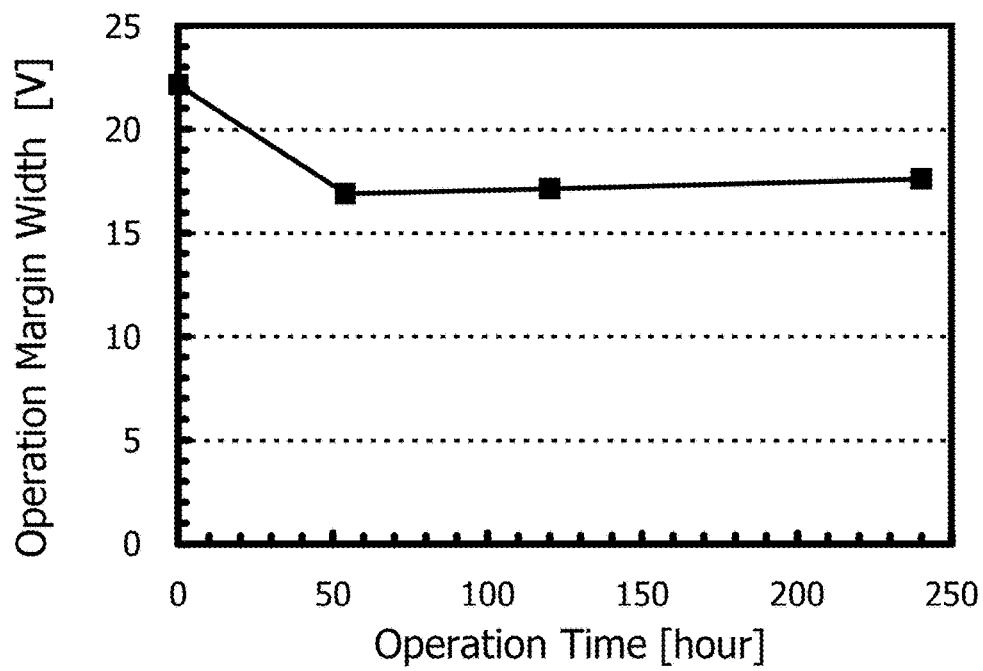
FIG. 19 is a graph showing a change in an operation margin width with respect to an operation time of a scan line driver circuit (subjected to heat treatment)

FIG. 19 illustrates a change in an operating margin width (V) with respect to an operation time (hour) in the scan line driver circuit included in the liquid crystal panel H. Further, FIG. 20 illustrates a change in an operating margin width (V) with respect to an operation time (hour) in the scan line driver circuit included in the liquid crystal panel I.

Figure 20:
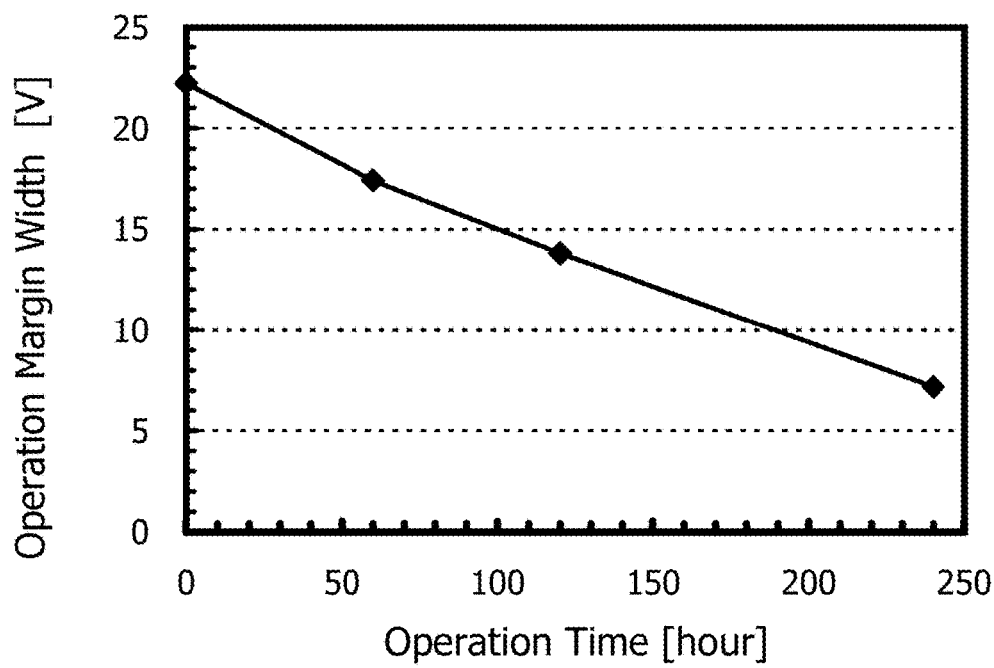
FIG. 20 is a graph showing a change in an operation margin width with respect to an operation time of a scan line driver circuit (not subjected to heat treatment)

From FIG. 19 and FIG. 20, the operating margin widths of the liquid crystal panels H and I were the same, about 22 V, at the start of the operation; however, after 220 hours, the operating margin width of the liquid crystal panel H was about 17 V, and the operating margin width of the liquid crystal panel I was about 7 V. Thus, the operating margin width of the liquid crystal panel I was decreased in a shorter time than that of the liquid crystal panel H. Therefore, it is recognized that the amount of shift in the threshold voltage of the transistor included in the scan line driver circuit of the liquid crystal panel H is smaller than that of the liquid crystal panel I.

This application is based on Japanese Patent Application serial no. 2012-227335 filed with Japan Patent Office on Oct. 12, 2012, the entire contents of which are hereby incorporated by reference.

What is claimed is:

1. A method for manufacturing a liquid crystal display device comprising the steps of:
   forming a transistor over a first substrate, the transistor comprising an oxide semiconductor film which includes a channel formation region;
   forming an insulating film over the transistor;
   forming a pixel electrode over the insulating film, the pixel electrode being in electrical contact with the transistor;
   heating the first substrate and a second substrate in a first chamber after forming the pixel electrode;
   setting the first chamber in an inert atmosphere after heating the first substrate and the second substrate;
   transferring the second substrate in the inert atmosphere;
   dropping a liquid crystal material on the second substrate after transferring the second substrate; and
   bonding the first substrate and the second substrate with each other with the liquid crystal material interposed therebetween under reduced pressure.

2. The method for manufacturing a liquid crystal display device according to claim 1, further comprising the step of:
   forming a ceramic layer over at least one of a pair of flat surfaces of the first substrate and the second substrate.

3. The method for manufacturing a liquid crystal display device according to claim 1, further comprising the step of:
   forming a ceramic layer over at least one of a pair of flat surfaces of the first substrate and the second substrate,
   wherein the ceramic layer comprises one of a metal oxide, a metal nitride, a metal carbide, a metal arsenide, a metal sulphide, a silicon oxide, and a silicon carbide and has a property of transmitting visible light.

4. The method for manufacturing a liquid crystal display device according to claim 1, wherein the step of heating the first substrate and the second substrate is performed at a temperature higher than or equal to 100° C.

5. The method for manufacturing a liquid crystal display device according to claim 1, wherein the step of bonding is performed in an atmosphere at a dew point of lower than or equal to −60° C.

6. The method for manufacturing a liquid crystal display device according to claim 1, wherein the oxide semiconductor film comprises indium, gallium, and zinc.

7. The method for manufacturing a liquid crystal display device according to claim 1, wherein the inert atmosphere is a nitrogen atmosphere or an argon atmosphere.

8. A method for manufacturing a liquid crystal display device comprising the steps of:
   forming a transistor over a first substrate, the transistor comprising an oxide semiconductor film which includes a channel formation region;
   forming an insulating film over the transistor;
   forming a pixel electrode over the insulating film, the pixel electrode being in electrical contact with the transistor;
   heating the first substrate and a second substrate under reduced pressure in a first chamber after forming the pixel electrode;
   setting the first chamber in an inert atmosphere after heating the first substrate and the second substrate;
   transferring the second substrate in the inert atmosphere;
   dropping a liquid crystal material on the second substrate after transferring the second substrate; and
   bonding the first substrate and the second substrate with each other with the liquid crystal material interposed therebetween under reduced pressure.

9. The method for manufacturing a liquid crystal display device according to claim 8, further comprising the step of:
   forming a ceramic layer over at least one of a pair of flat surfaces of the first substrate and the second substrate.

10. The method for manufacturing a liquid crystal display device according to claim 8, further comprising the step of:
    forming a ceramic layer over at least one of a pair of flat surfaces of the first substrate and the second substrate,
    wherein the ceramic layer comprises one of a metal oxide, a metal nitride, a metal carbide, a metal arsenide, a metal sulphide, a silicon oxide, and a silicon carbide and has a property of transmitting visible light.

11. The method for manufacturing a liquid crystal display device according to claim 8, wherein the step of heating the first substrate and the second substrate is performed at a temperature higher than or equal to 100° C.

12. The method for manufacturing a liquid crystal display device according to claim 8, wherein the step of bonding is performed in an atmosphere at a dew point of lower than or equal to −60° C.

13. The method for manufacturing a liquid crystal display device according to claim 8, wherein the oxide semiconductor film comprises indium, gallium, and zinc.

14. The method for manufacturing a liquid crystal display device according to claim 8, wherein the inert atmosphere is a nitrogen atmosphere or an argon atmosphere.

15. A method for manufacturing a liquid crystal display device comprising the steps of:
    forming a transistor over a first substrate, the transistor comprising an oxide semiconductor film which includes a channel formation region;
    forming an insulating film over the transistor;
    forming a pixel electrode over the insulating film, the pixel electrode being in electrical contact with the transistor;
    heating the first substrate after forming the pixel electrode;
    heating a second substrate in a first chamber;
    setting the first chamber in an inert atmosphere after heating the first substrate and the second substrate;
    transferring the second substrate in the inert atmosphere;

dropping a liquid crystal material on the second substrate after transferring the second substrate; and bonding the first substrate and the second substrate with each other with the liquid crystal material interposed therebetween under reduced pressure.

16. The method for manufacturing a liquid crystal display device according to claim 15, further comprising the step of:
forming a ceramic layer over at least one of a pair of flat surfaces of the first substrate and the second substrate.

17. The method for manufacturing a liquid crystal display device according to claim 15, further comprising the step of:
forming a ceramic layer over at least one of a pair of flat surfaces of the first substrate and the second substrate, wherein the ceramic layer comprises one of a metal oxide, a metal nitride, a metal carbide, a metal arsenide, a metal sulphide, a silicon oxide, and a silicon carbide and has a property of transmitting visible light.

18. The method for manufacturing a liquid crystal display device according to claim 15,
wherein the step of heating the first substrate is formed at a temperature higher than or equal to 100° C., and
wherein the step of heating the second substrate is performed at a temperature higher than or equal to 100° C.

19. The method for manufacturing a liquid crystal display device according to claim 15, wherein the step of bonding is performed in an atmosphere at a dew point of lower than or equal to −60° C.

20. The method for manufacturing a liquid crystal display device according to claim 15, wherein the oxide semiconductor film comprises indium, gallium, and zinc.

21. The method for manufacturing a liquid crystal display device according to claim 15, wherein the inert atmosphere is a nitrogen atmosphere or an argon atmosphere.

* * * * *